(12) United States Patent
Tapias et al.

(10) Patent No.: US 11,805,645 B2
(45) Date of Patent: Oct. 31, 2023

(54) INTEGRATED ASSEMBLIES HAVING RUGGED MATERIAL FILL, AND METHODS OF FORMING INTEGRATED ASSEMBLIES

(71) Applicant: Micron Technology, Inc., Boise, ID (US)

(72) Inventors: Nicholas R. Tapias, Boise, ID (US); Andrew Li, Boise, ID (US); Adam W. Saxler, Boise, ID (US); Kunal Shrotri, Boise, ID (US); Erik R. Byers, Boise, ID (US); Matthew J. King, Boise, ID (US); Diem Thy N. Tran, Garden City, ID (US); Wei Yeeng Ng, Boise, ID (US); Anish A. Khandekar, Boise, ID (US)

(73) Assignee: Micron Technology, Inc., Boise, ID (US)

(*) Notice: Subject to any disclaimer, the term of this patent is extended or adjusted under 35 U.S.C. 154(b) by 29 days.

(21) Appl. No.: 16/542,645

(22) Filed: Aug. 16, 2019

(65) Prior Publication Data

US 2021/0050364 A1 Feb. 18, 2021

(51) Int. Cl.
*H10B 43/27* (2023.01)
*H01L 21/02* (2006.01)
(Continued)

(52) U.S. Cl.
CPC .......... *H10B 43/27* (2023.02); *H01L 21/0217* (2013.01); *H01L 21/02164* (2013.01);
(Continued)

(58) Field of Classification Search
CPC ....... H01L 21/823821; H01L 21/28562; H01L 21/32139; H01L 21/28194; H01L 25/50;
(Continued)

(56) References Cited

U.S. PATENT DOCUMENTS 5,753,948 A * 5/1998 Nguyen ................. H01L 28/87
257/307
7,033,881 B2 4/2006 Gaidis et al.
(Continued)

FOREIGN PATENT DOCUMENTS

KR 10-2017-0115753 10/2017
KR 10-2018-0047639 5/2018
(Continued)

OTHER PUBLICATIONS

WO PCT/US2020/042889 Search Rept., dated Nov. 5, 2020.
(Continued)

*Primary Examiner* — Kyoung Lee
(74) *Attorney, Agent, or Firm* — Wells St. John P.S.

(57) ABSTRACT

Some embodiments include a structure having an opening extending into an integrated configuration. A first material is within the opening, and is configured to create an undulating topography relative to a sidewall of the opening. The undulating topography has a surface roughness characterized by a mean roughness parameter $R_{mean}$ which is the mean peak-to-valley distance along the undulating topography. The $R_{mean}$ is at least about 4 nm. A second material is within the opening and along at least a portion of the undulating topography. The first and second materials are compositionally different from one another. Some embodiments include integrated assemblies. Some embodiments include methods of forming integrated assemblies.

81 Claims, 19 Drawing Sheets

(51) Int. Cl.
*H01L 21/285* (2006.01)
*H10B 41/27* (2023.01)

(52) U.S. Cl.
CPC .. *H01L 21/02532* (2013.01); *H01L 21/02631* (2013.01); *H01L 21/02636* (2013.01); *H01L 21/28568* (2013.01); *H10B 41/27* (2023.02)

(58) Field of Classification Search
CPC ............... H01L 27/0924; H01L 29/785; H01L 27/11582; H01L 27/11556; H01L 21/02532; H01L 21/02631; H01L 21/0217; H01L 21/02568; H01L 21/02164; H01L 21/02636; H01L 21/11556; H01L 21/28568; H01L 27/11542; H01L 27/1157; H01L 27/11521; H01L 27/11568; H10B 43/27; H10B 41/27; H10B 41/35; H10B 43/35; H10B 43/30; H10B 41/30
See application file for complete search history.

(56) References Cited

U.S. PATENT DOCUMENTS

| | | | |
|---|---|---|---|
| 10,115,681 | B1 | 10/2018 | Ariyoshi |
| 10,403,638 | B2 | 9/2019 | Lee et al. |
| 10,418,377 | B2 | 9/2019 | Van Houdt et al. |
| 10,553,477 | B2 | 2/2020 | Maestre Caro et al. |
| 10,629,675 | B1* | 4/2020 | Nishikawa ........ H01L 27/11519 |
| 10,636,811 | B1* | 4/2020 | Chiu ................. H01L 21/76876 |
| 10,741,571 | B2 | 8/2020 | Yoon et al. |
| 2003/0222298 | A1* | 12/2003 | Yu ............................ H01L 28/60 257/306 |
| 2005/0124113 | A1* | 6/2005 | Yoneda ................... H01L 28/84 438/255 |
| 2005/0158945 | A1 | 7/2005 | Birner et al. |
| 2005/0205859 | A1 | 9/2005 | Currie et al. |
| 2006/0244102 | A1* | 11/2006 | Hoshino ........... H01L 27/10852 257/534 |
| 2007/0037347 | A1* | 2/2007 | Kim ....................... B82Y 10/00 438/243 |
| 2008/0293165 | A1* | 11/2008 | Ran ......................... G11C 11/16 438/3 |
| 2013/0157466 | A1* | 6/2013 | Fox .................... C23C 16/45523 438/694 |
| 2013/0164907 | A1* | 6/2013 | Lee ......................... H01L 21/76 438/400 |
| 2016/0111434 | A1* | 4/2016 | Pachamuthu ....... H01L 29/7883 257/314 |
| 2016/0343612 | A1* | 11/2016 | Wang ................ H01L 21/76877 |
| 2017/0213820 | A1* | 7/2017 | Balakrishnan ...... H01L 27/1087 |
| 2018/0130814 | A1 | 5/2018 | Lee |
| 2018/0342518 | A1* | 11/2018 | Kim .................. H01L 27/10879 |
| 2019/0081065 | A1 | 3/2019 | Lee |
| 2019/0164905 | A1* | 5/2019 | Hsieh .................. H01L 25/0652 |
| 2020/0083225 | A1* | 3/2020 | Ma ..................... H01L 27/10805 |
| 2020/0176191 | A1* | 6/2020 | Park ...................... H01L 23/291 |
| 2021/0050364 | A1* | 2/2021 | Tapias ............... H01L 21/28568 |
| 2021/0313183 | A1* | 10/2021 | Ba ......................... C23C 16/045 |

FOREIGN PATENT DOCUMENTS

| | | |
|---|---|---|
| KR | 10-2018-0076298 | 7/2018 |
| TW | 591792 | 6/2004 |
| TW | I345238 | 7/2011 |
| TW | 201730991 | 9/2017 |

OTHER PUBLICATIONS

WO PCT/US2020/042889 Writ. Opin., dated Nov. 5, 2020.
TW 109126157—SrchRpt_Transl, dated Mar. 21, 2021.
WO PCT/US2020/042889 IPRP, dated Feb. 17, 2022.

* cited by examiner

INTEGRATED ASSEMBLIES HAVING RUGGED MATERIAL FILL, AND METHODS OF FORMING INTEGRATED ASSEMBLIES

TECHNICAL FIELD

Integrated assemblies (e.g., integrated NAND assemblies), and methods of forming integrated assemblies. Assemblies having rugged material fill within slits (trenches and/or other openings.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SOS drivers 322, 324, 326 may concurrently couple or cut off the SGSs of the strings of a corresponding partial block (e.g., tile column) independently of those of other partial blocks. A global access line (e.g., a global CG line)

350 may couple the charge-storage devices corresponding to the respective tier of each of the plurality of strings. Each global CO line (e.g., the global CO line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

FIGS. 5 and 5A show a region of an example prior art integrated assembly 10 comprising a portion of an example NAND configuration. The assembly 10 includes a pair of sub-blocks within a tile region. The sub-blocks may be referred to as block regions 11. The sub-blocks and tile may be incorporated into three-dimensional NAND architecture of the types described above in FIGS. 1-4.

A partition 12 extends around the sub-blocks, and separates the sub-blocks from one another and from other sub-blocks. The partition 12 comprises a partition material 14. The partition material 14 may comprise, consist essentially of, or consist of silicon dioxide.

The cross-sectional view of FIG. 5A shows that the assembly 10 includes a stack 16 of alternating conductive levels 18 and insulative levels 20. The levels 18 comprise conductive material 19, and the levels 20 comprise insulative material 21.

The block regions 11 are laterally offset from a staircase region (labeled "Staircase" in FIG. 5), which is a region where electrical contact is made to at least some of the stacked conductive levels 18.

The conductive material 19 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 19 may include metal (e.g., tungsten) and metal nitride (e.g., tantalum nitride, titanium nitride, etc.).

The insulative material 21 may comprise any suitable composition(s); and in some embodiments may comprise, consist essentially of; or consist of silicon dioxide.

The levels 18 and 20 may be of any suitable thicknesses; and may be the same thickness as one another, or different thicknesses relative to one another. In some embodiments, the levels 18 and 20 may have vertical thicknesses within a range of from about 10 nanometers (nm) to about 400 nm.

In some embodiments, the lowermost conductive level 18 may be representative of a source-select device (e.g., source-side select gate, SGS); and the upper conductive levels 18 may be representative of wordline levels. The source-select-device level may or may not comprise the same conductive material(s) as the wordline levels.

Although eight conductive levels 18 are shown in FIG. 5A, in practice there may be more than eight conductive levels in the stack 16. For instance, the wordline levels may ultimately correspond to memory cell levels of a NAND configuration. The NAND configuration will include strings of memory cells (i.e., NAND strings), with the number of memory cells in the strings being determined by the number of vertically-stacked wordline levels. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc. Also, the source-select device may include more than one conductive level.

The stack 16 and the partition 12 are supported over a conductive structure 22. Such conductive structure may comprise semiconductor material (not specifically delineated in the drawings) over a metal-containing material (not specifically delineated in the drawings). The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise conductively-doped silicon; such as, for example, n-type doped polysilicon. The metal-containing material may comprise any suitable composition(s), such as, for example, one or more of various metals (e.g., titanium, tungsten, cobalt, nickel, platinum, ruthenium, etc.) and/or metal-containing compositions (e.g., metal silicide, metal nitride, metal carbide, etc.).

In some embodiments, the conductive structure 22 may correspond to a source structure (e.g., a structure comprising the so-called common source line 216 of FIG. 4). The source structures of FIGS. 1-4 are referred to as "lines" in accordance with traditional nomenclature, but such lines may be comprised by an expanse rather than a simple wiring line.

Channel-material pillars 24 extend through the stack 16. The pillars 24 comprise channel material 26. The channel material 26 may be appropriately-doped semiconductor material, and in some embodiments may comprise silicon. The channel material 26 is spaced from the materials 19 and 21 of the stack 16 by regions 28. Such regions may include one or more of dielectric-barrier material, charge-blocking material, charge-storage material and gate dielectric material (i.e., tunneling material).

The illustrated channel-material structures 24 are hollow channel configurations, with the channel material 26 laterally surrounding an insulative material 29. The insulative material 29 may comprise any suitable composition(s); and in some embodiments may comprise silicon dioxide. In other embodiments (not shown) the channel-material structures 24 may be solid pillars.

Memory cells 30 (only some of which are labeled) are along the conductive levels 18, and include regions of the channel material 26 and the materials within the regions 28 (i.e., the dielectric-barrier material, charge-blocking material, charge-storage material and gate dielectric material). The memory cells 30 may be arranged in vertical NAND strings of the types described in FIGS. 1-4. The memory cells 30 may be referred to as NAND memory cells, and the conductive levels 18 may be referred to as NAND wordline levels.

The conductive structure 22 may be supported by a semiconductor substrate 32. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. A gap is provided between the substrate 32 and the structure 22 to indicate that there may be other materials and components provided between the substrate 32 and the structure 22.

The conductive structure 22 is shown to be electrically coupled with CMOS (complementary metal oxide semiconductor). The CMOS may be in any suitable location relative to the conductive structure 22, and in some embodiments may be under such conductive structure and supported by the substrate 32. The CMOS may comprise logic or other appropriate circuitry for driving the source structure 22 during operation of memory associated with the stack 16. Although the circuitry is specifically identified to be CMOS in the embodiment of FIG. 5A, it is to be understood that such circuitry could be replaced with any other suitable circuitry in other embodiments.

FIGS. 5 and 5A show a desired arrangement in which the block regions 11 are appropriately oriented over the structure 22. However, in practice it is sometimes found that the actual arrangement has tipped block regions (shown in FIG. 8) for reasons described relative to FIGS. 6-8.

FIG. 6 show the assembly 10 at a prior art process stage which may be utilized to form the assembly of FIG. 5A. Slits (trenches) 34 have been formed through the stack 16 in locations where the panels 12 of FIG. 5A will ultimately be formed. In some applications, the conductive levels 18 are formed by replacing sacrificial material (e.g., silicon nitride) with the conductive material 19 (so-called gate-replacement methodology), and the slits 34 provide access which enables such replacement.

Referring to FIG. 7, material 14 is formed within the slits 34. The material 14 may be one or more of dielectric, semiconductor, metal, etc.; and in some applications may comprise amorphous silicon. FIG. 7 shows a process stage in which the material 14 has only partially filled the slits. A problem that can occur is that various forces (stresses, cohesive forces, etc.) may cause the block regions 11 to bend as the slits 34 are filled with the material 14, causing the undesired configuration of FIG. 8. Specifically one of the slits 34 has collapsed (the central slit shown in FIG. 8), and the other slits 34 have widened. The material 14 within the collapsed slit has coalesced across the slit to pinch off the slit. The configuration of FIG. 8 may lead to toppling and/or to other problematic structural issues, and may ultimately lead to device failure. The large void at the bottom of the middle slit of FIG. 8 could be mostly filled in some applications. It may be that coalescence along smooth surfaces of the material 14 is at least partially responsible for driving the problematic block-bending.

It would be desirable to alleviate or prevent the problematic slit collapse and associated block bending) shown in FIG. 8.

DETAILED DESCRIPTION OF THE ILLUSTRATED EMBODIMENT

Figure 7:
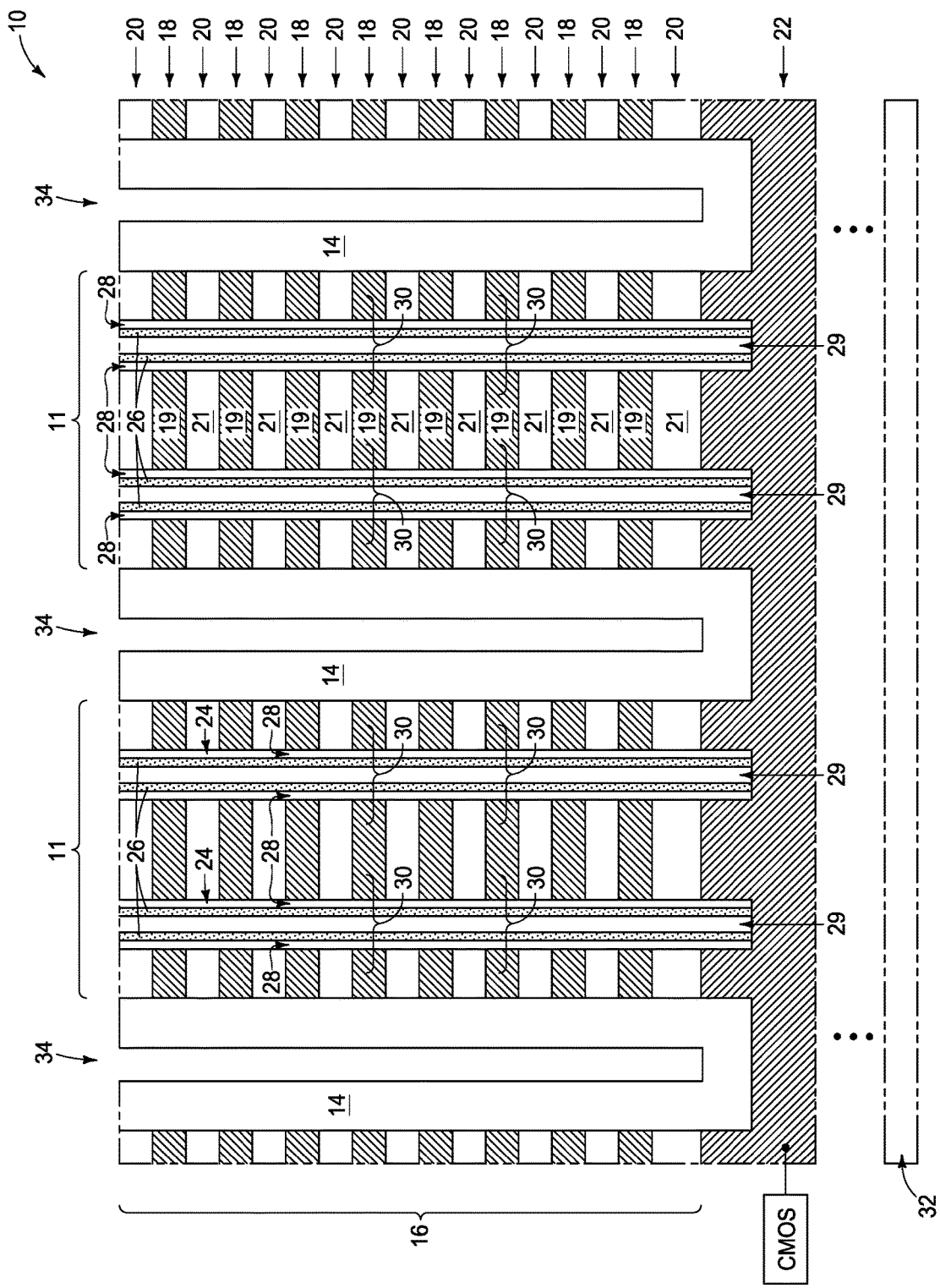
FIGS. 7 and 8 are diagrammatic cross-sectional side views of the prior art integrated assembly of FIG. 6 at prior art process stages following the process stage of FIG. 6.
Figure 8:
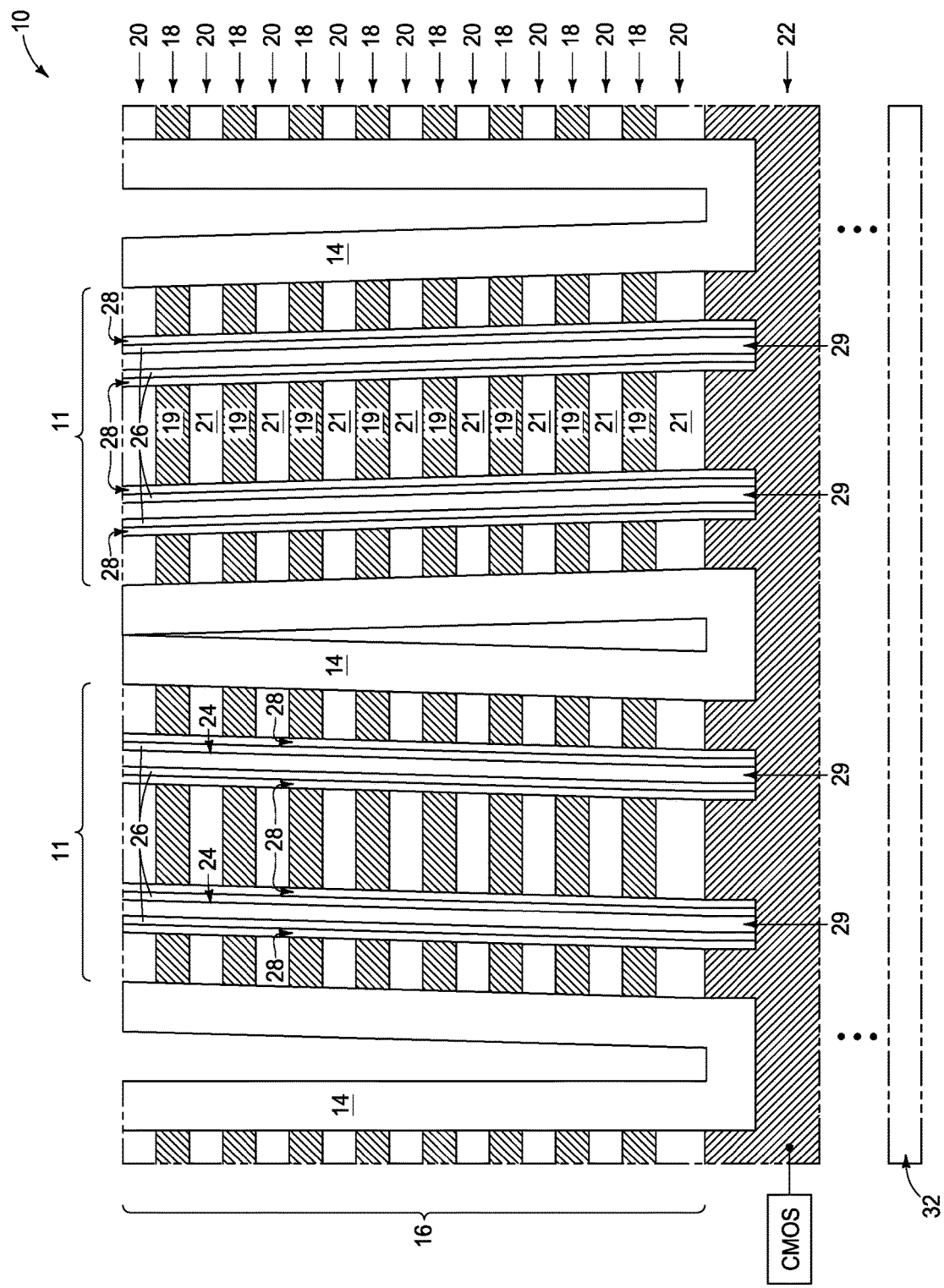

Some embodiments include methods of forming integrated assemblies in which a rugged material is provided within slits (trenches), such as the slits which separate adjacent block regions from one another in three-dimensional NAND. The rugged material may alleviate or preclude blocking-bending problems, such as those described above with reference to FIGS. 6-8. The rugged material may only partially fill the slits, and additional material may be deposited within the slits to fill around the rugged material. Some embodiments include integrated assemblies having rugged fill material within trenches and/or other openings. The rugged fill material may provide a rugged topography characterized by a mean roughness ($R_{mean}$) and/or a maximum roughness ($R_{max}$), with the mean, roughness measured as peak-to-valley dimensions along the topography. The rugged fill material may have a mean grain size of at least about 4 nanometers (nm). Example embodiments are described with reference to FIGS. 9-18.

Figure 1:
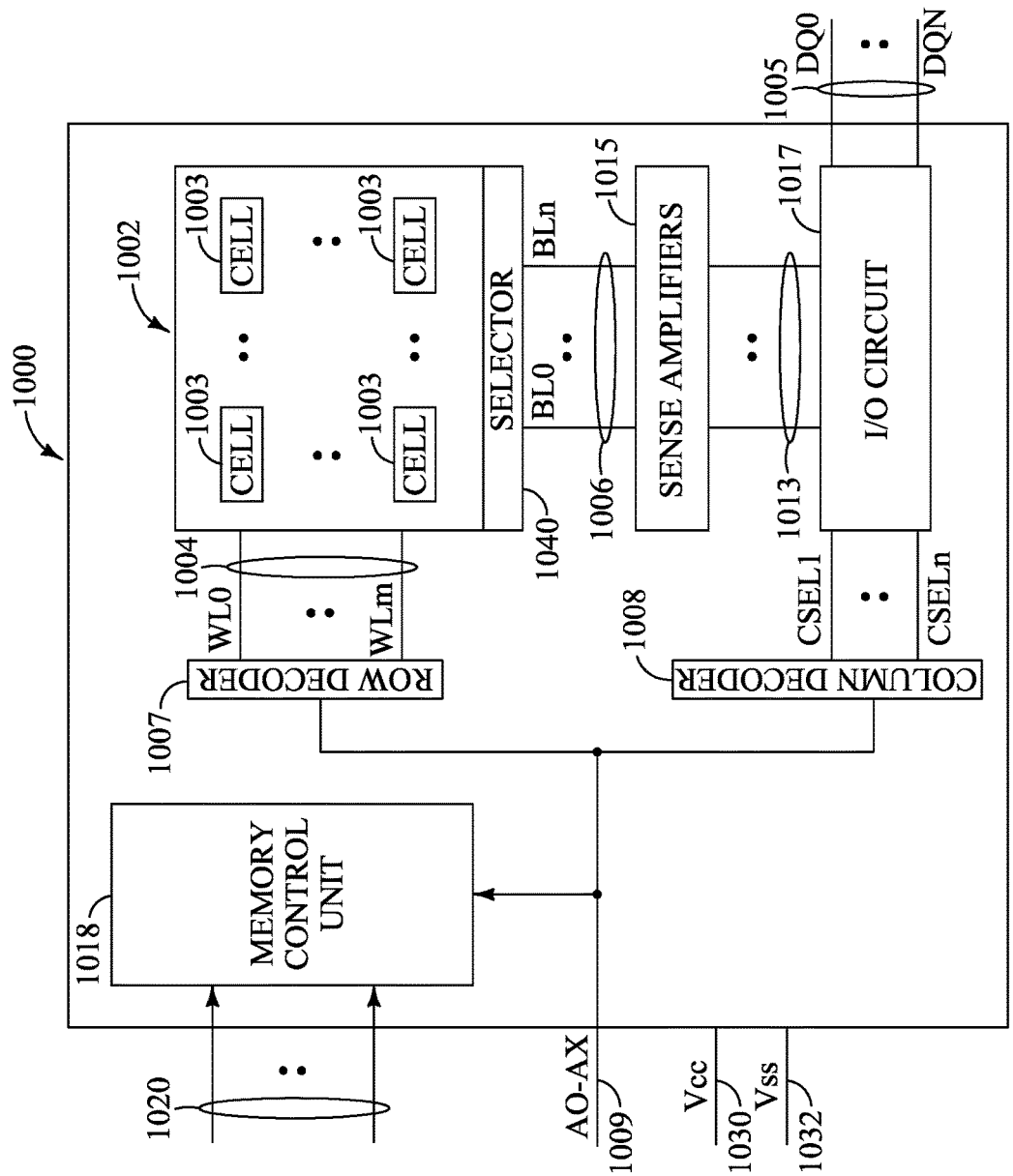
FIG. 1 shows a block diagram of a prior art memory device having a memory array with memory cells.
Figure 2:
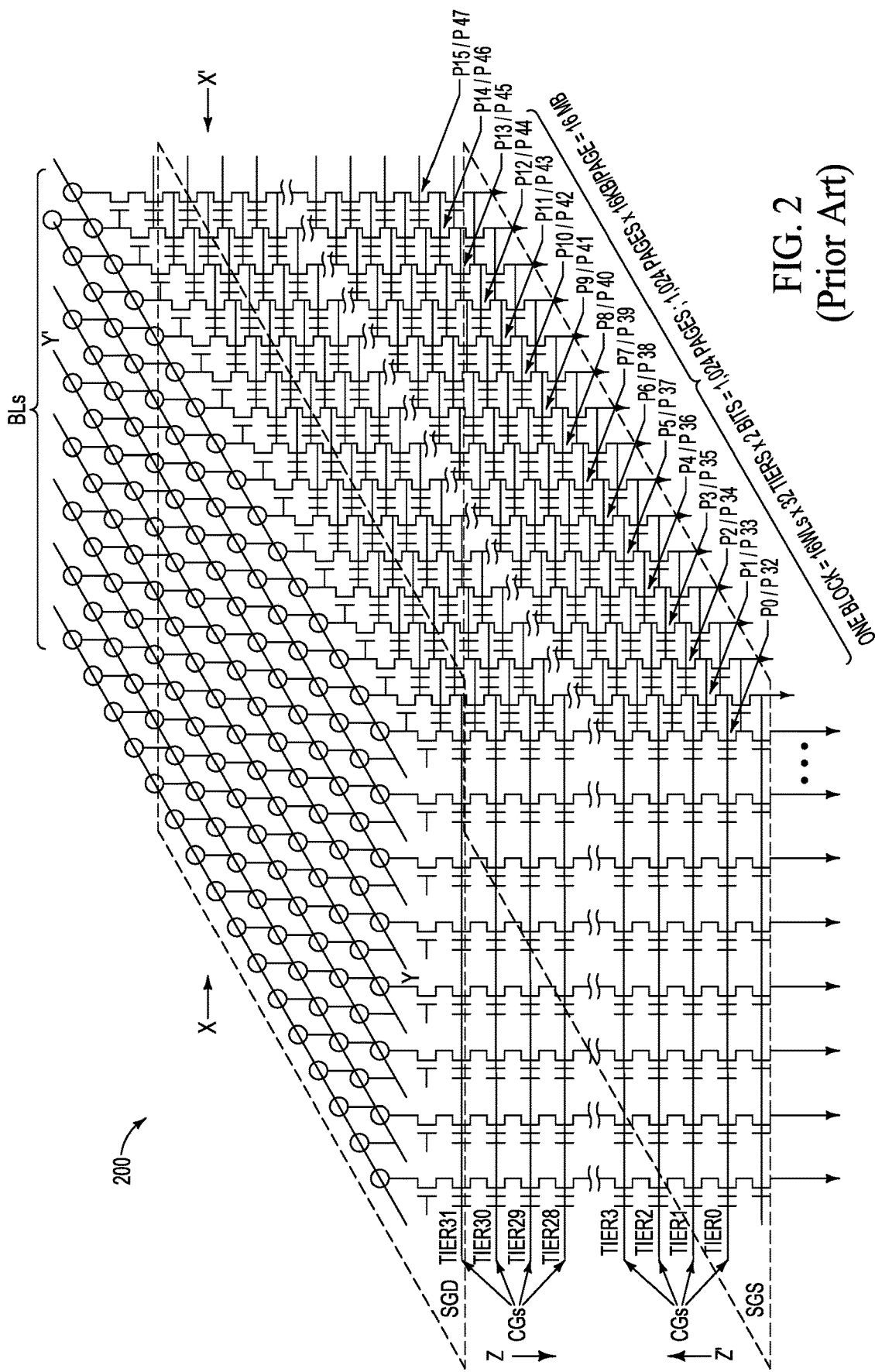
FIG. 2 shows a schematic diagram of the prior art memory array of FIG. 1 in the form of a 3D NAND memory device.
Figure 3:
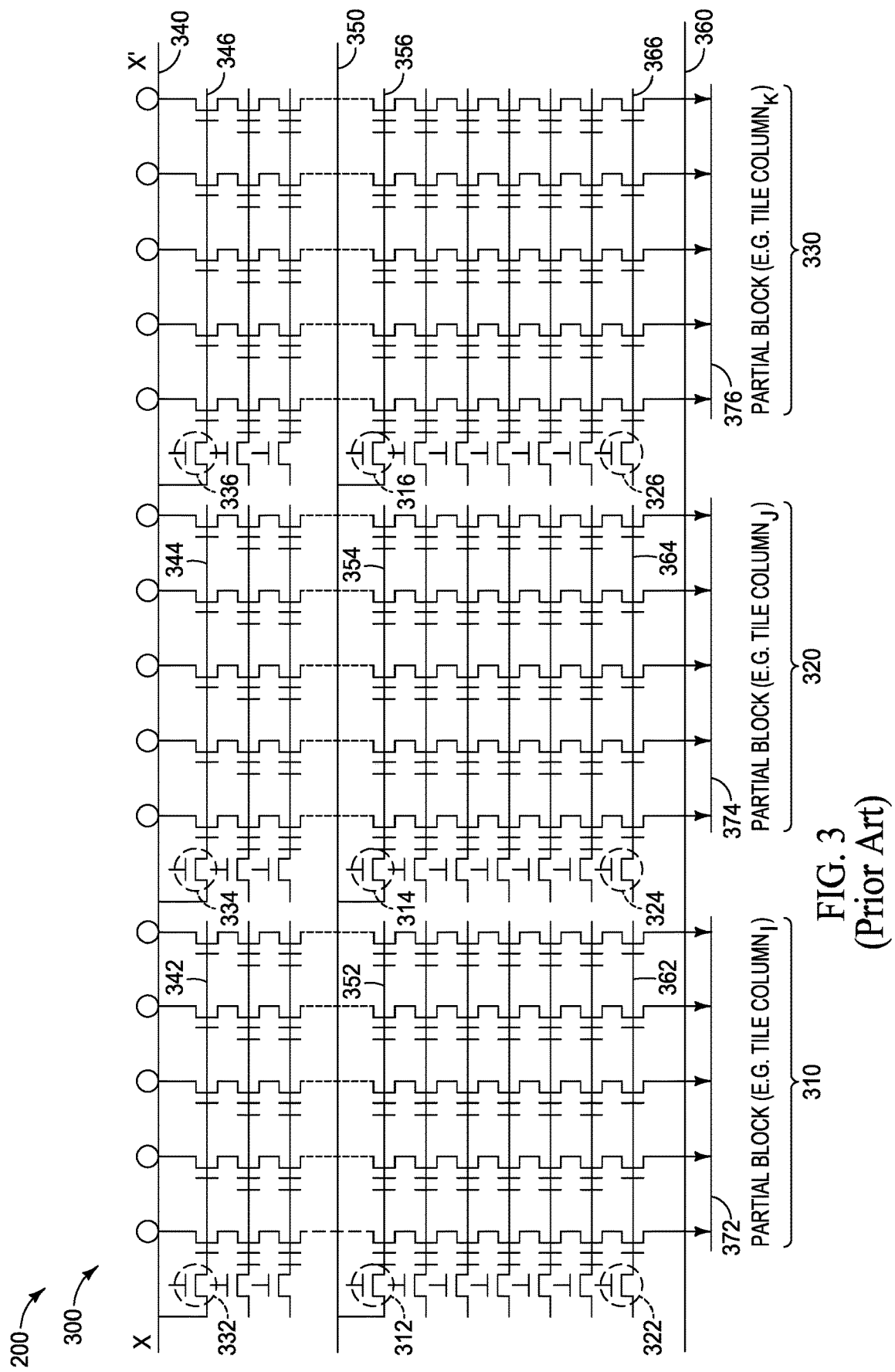
FIG. 3 shows a cross-sectional view of the prior art 3D NAND memory device of FIG. 2 in an X-X' direction.
Figure 4:
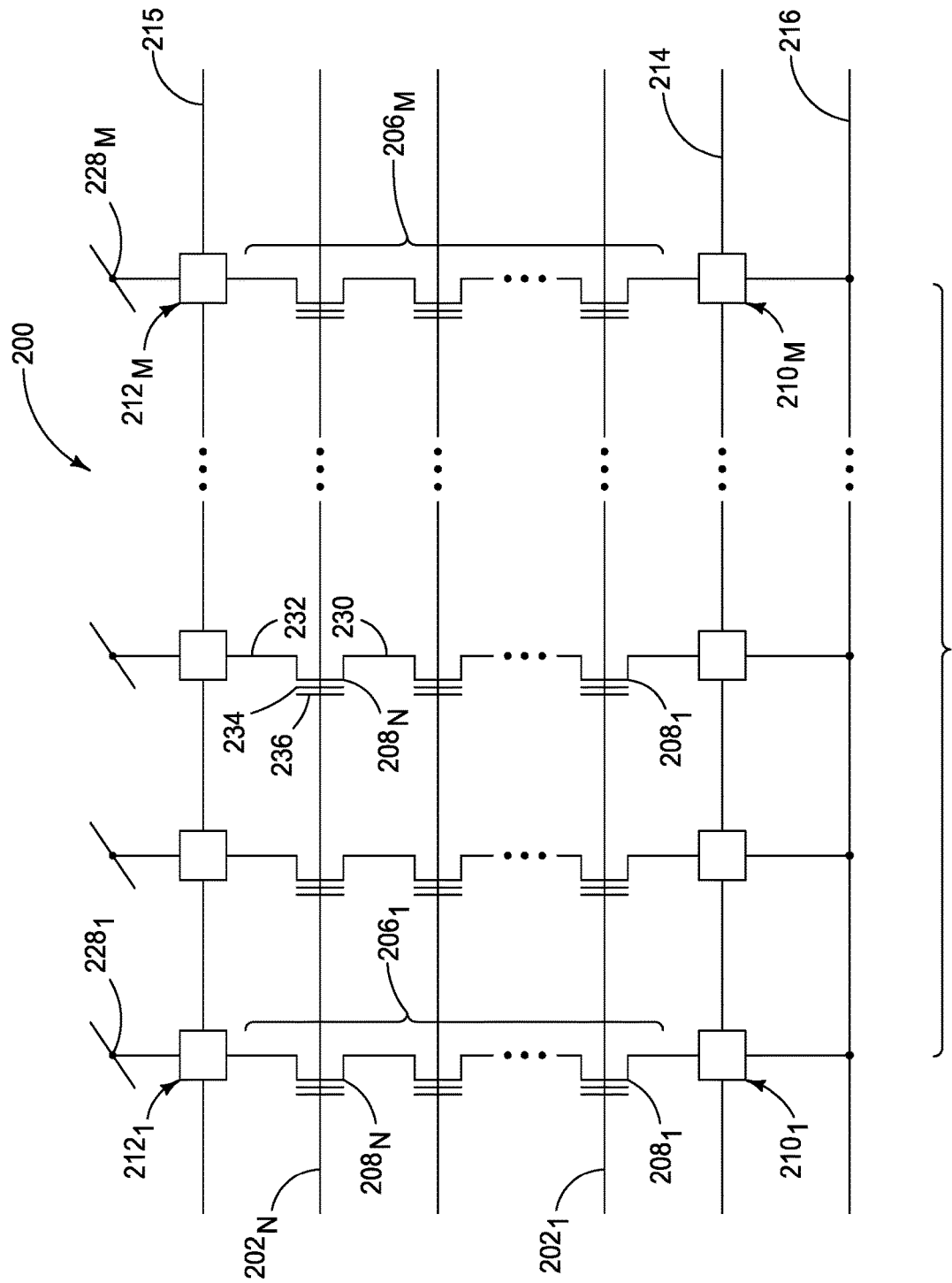
FIG. 4 is a schematic diagram of a prior art NAND memory array.
Figure 5:
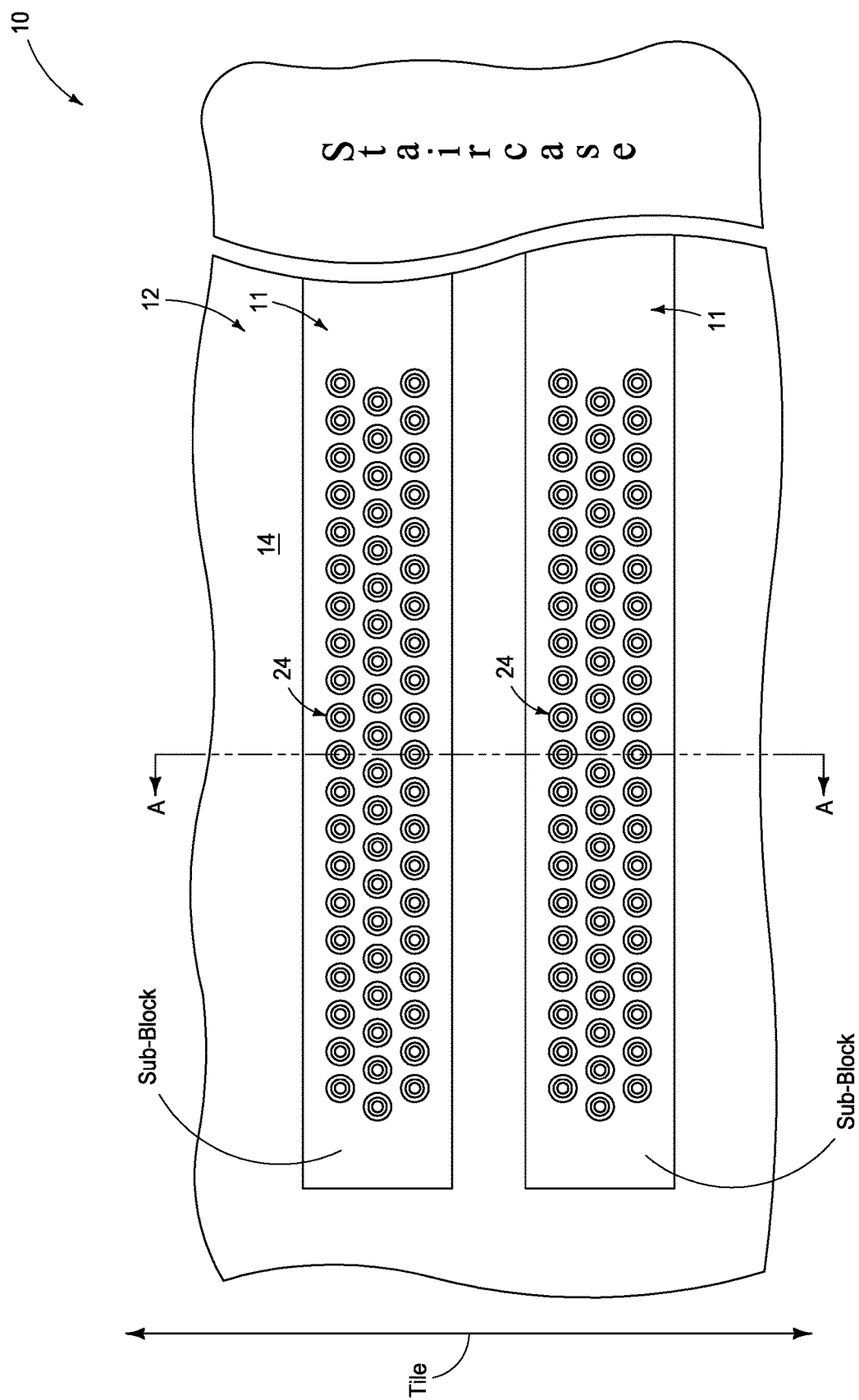
FIG. 5 is a diagrammatic top view of a region of a prior art integrated assembly illustrating an example architecture.
Figure 5A:
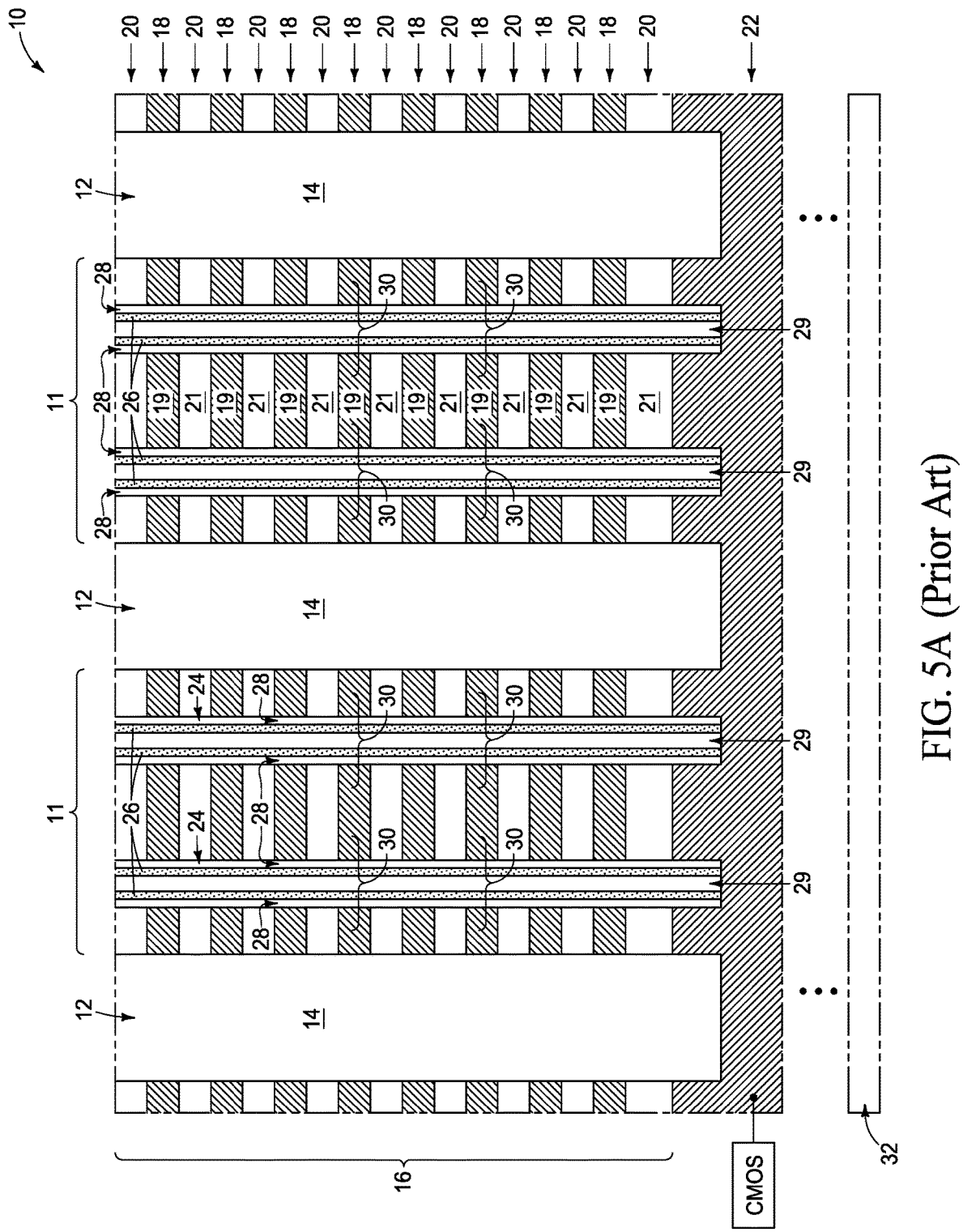
FIG. 5A is a diagrammatic cross-sectional side view of the prior art integrated assembly of FIG. 5 along the line A-A of FIG. 5.
Figure 6:
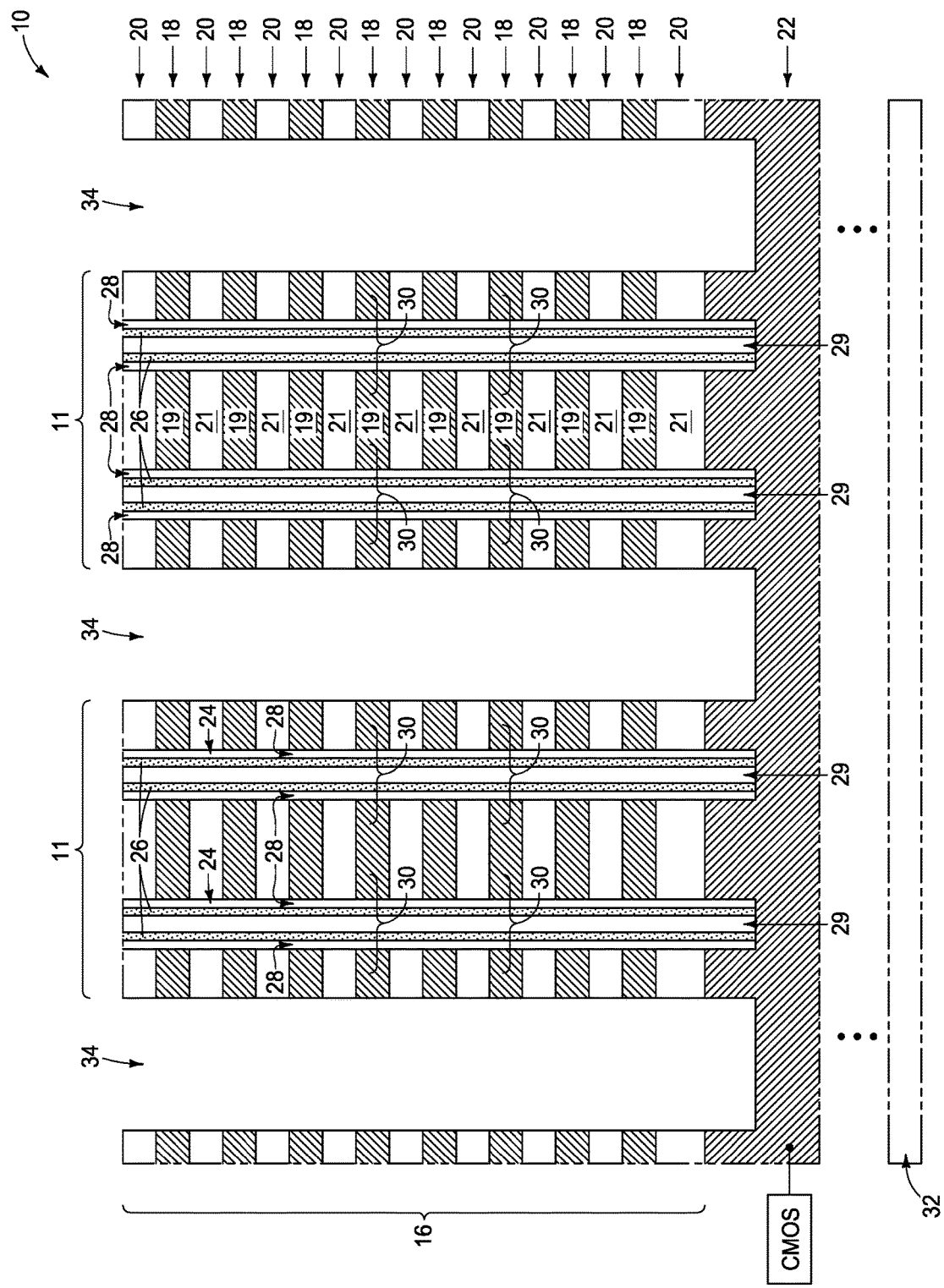
FIG. 6 is a diagrammatic cross-sectional side view of a prior art integrated assembly at a prior art process stage that may be utilized to form the assembly of FIG. 5A.
Figure 9:
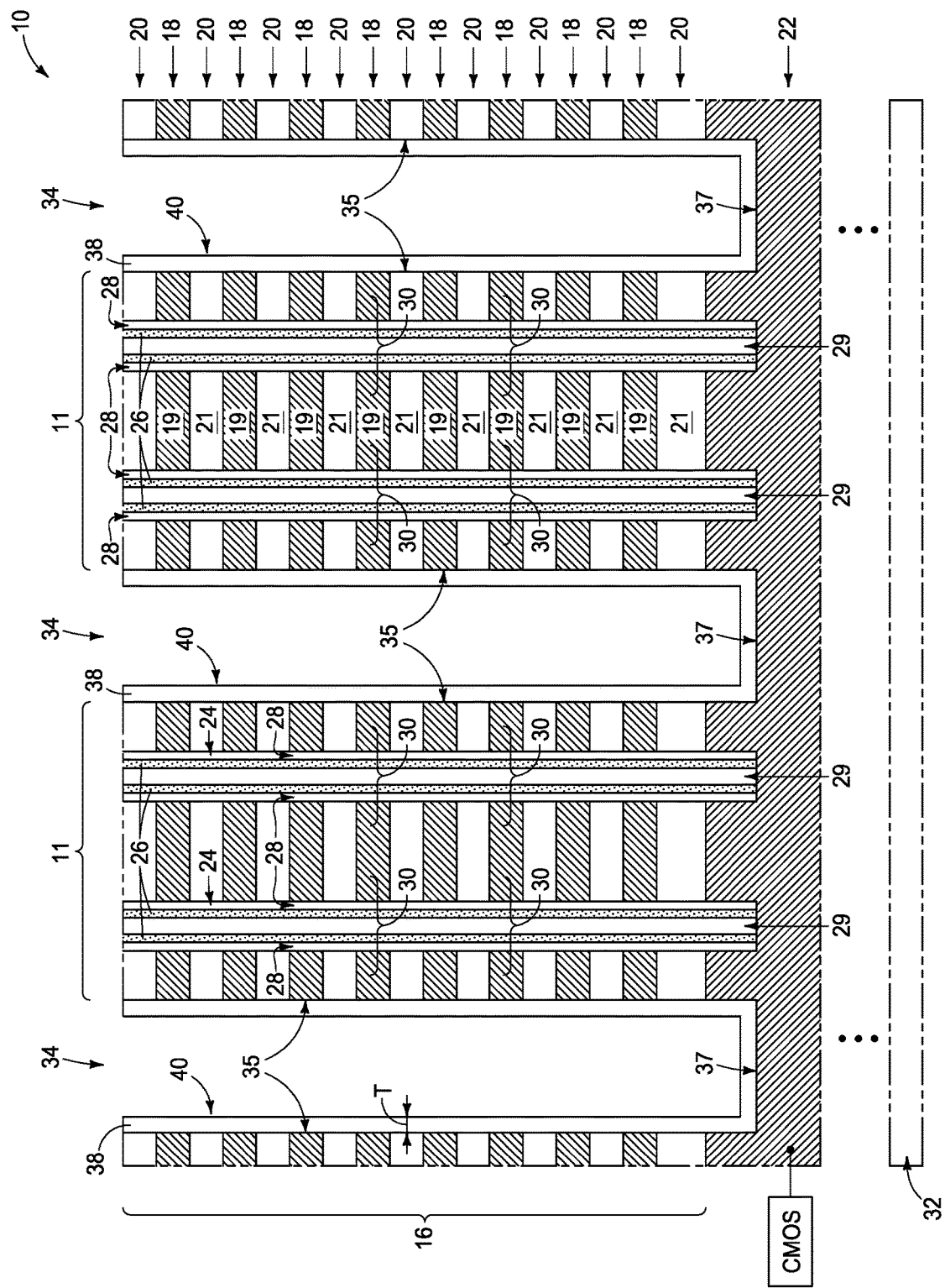
FIG. 9 is a diagrammatic cross-sectional side view of an assembly at an example process stage which may follow the process stage of FIG. 6.

Referring to FIG. 9, the integrated assembly (configuration, construction, structure, architecture, memory device, etc.) 10 is shown at a process stage which may follow the above-discussed prior art processing stage of FIG. 6. The stack 16 of the alternating insulative levels 20 and conductive levels 18 has been formed, and the channel material pillars 24 have been formed to extend through the stack 16. The slits (openings, recesses, trenches, etc.) 34 have also been formed to extend through the stack 16, and to subdivide the stack into the block regions 11.

The slits 34 comprise sidewalls 35 and bottoms 37; with the bottoms 37 being adjacent to the conductive structure 22, and the sidewalls 35 being adjacent to the conductive material 19 and insulative material 21 of the levels 18 and 20. An optional insulative material 38 is formed within the slits 34 to line the sidewalk and bottoms of the slits. The insulative material 38 may be considered to be configured as insulative liners 40 provided within the slits 34.

The insulative material 38 may comprise any suitable composition(s); and in some embodiments may comprise one or more of silicon dioxide, silicon nitride, high-k dielectric material (e.g., aluminum oxide) and low-k dielectric material (e.g., porous silicon dioxide). The term "high-k dielectric material" means a dielectric material having a dielectric constant greater than that of silicon dioxide, and the term "low-k dielectric material" means a dielectric material having a dielectric constant less than that of silicon dioxide.

The insulative material 38 has a thickness "T". Such thickness may be within a range of from about 10 nm to about 100 nm; and in some embodiments may be less than or equal to about 40 nm.

Figure 10:
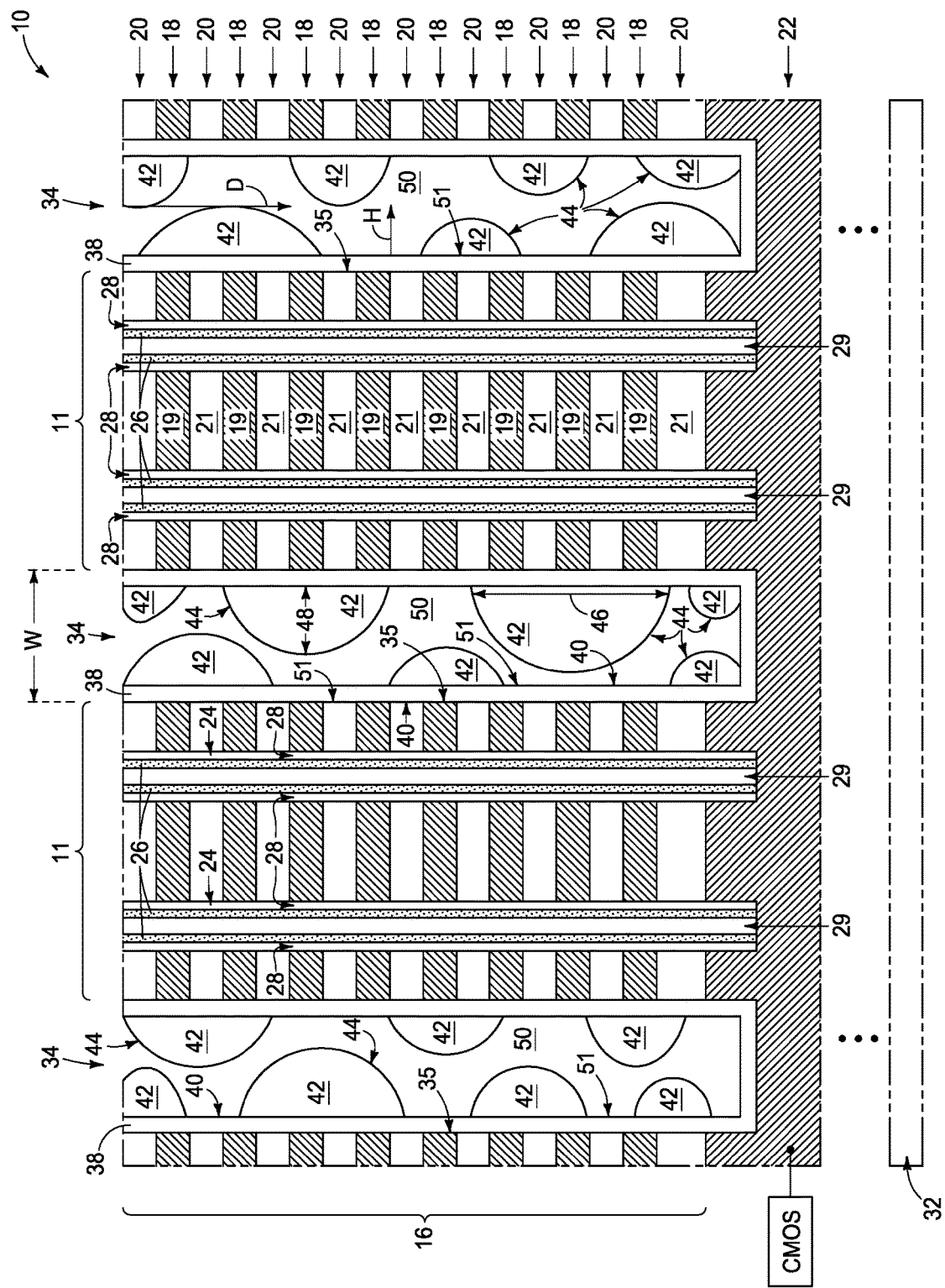
FIG. 10 is a diagrammatic cross-sectional side view of the assembly of FIG. 9 at an example process stage which may follow the process stage of FIG. 9.

Referring to FIG. 10, a first material 42 is formed within the lined slits (lined openings) 34. The first material 42 partially fills the lined slits 34, and leaves unfilled regions 50 within the slits 34. In the illustrated embodiment, the first material 42 is configured as large granules 44 (only some of which are labeled). In some embodiments, the granules 44 may correspond to individual (discrete) crystalline grains. In other embodiments, the granules 44 may be polycrystalline, amorphous, etc.

The first material 42 may be referred to as a granular first material. Such granular first material has a mean granule maximum (maximal) dimension ($Dmax_{mean}$) along the cross-section of FIG. 10. The mean granule maximum dimension corresponds to an average of the maximum cross-sectional dimensions of the individual granules along the cross-section through the granules. The mean granule maximum dimension may be ascertained with any suitable method. An example maximum (maximal) cross-sectional dimension 46 is illustrated for one of the granules 44 within the central slit 34. The maximal cross-sectional dimension 46 happens to be along the vertical direction relative to the cross-section of FIG. 10. Other granules may have maximal cross-sectional dimensions which extend in other directions. If the granules are individual grains, the mean granule maximum dimension ($Dmax_{mean}$) may correspond to a mean grain size ($Gr_{mean}$).

In some embodiments, the maximal horizontal dimensions of the granules may be useful for quantitating roughness characteristics of the granules relative to the sidewalls 35 of the slits 34. An example maximal horizontal granule dimension 48 is illustrated relative to one of the granules 44 within the central slit 34.

In some embodiments, the mean granule maximum dimension ($Dmax_{mean}$) of the granules 44 along the cross-section of FIG. 10 will be at least about 4 nm. In some embodiments, such mean granule maximum dimension may be at least about 10 nm, at east about 20 nm, at least about 50 nm, at least about 100 nm, etc.

In some embodiments, the average of the horizontal granule dimensions 48 of the granules 44 along the cross-section of FIG. 10 may be at least about 4 nm, at least about 10 nm, at least about 20 nm, at least about 50 nm, at least about 100 nm, etc.

In some embodiments, the mean granule maximum dimension of the granules 44 may be related to a width W of the slits 34. Such width may be, for example, within a range of from about 100 nm to about 500 nm. The mean granule maximum dimension of the granules 44 along the cross-section of FIG. 10 may be at least about 1% of the width W, at least about 2% of such width, at least about 5% of such width, at least about 10% of such width, at least about 25% of such width, at least about 40% of such width, etc.

In the illustrated embodiment of FIG. 10, the unfilled regions 50 are between the granules 44 of the granular first material 42.

The granular first material 42 may be formed by any suitable method, including, example, one or more of atomic layer deposition (ALD), chemical vapor deposition (CVD), sputtering, physical vapor deposition (PVD), etc.

The first material 42 may comprise any suitable composition(s); and in some embodiments may comprise insulative material, conductive material and/or semiconductor material.

If the first material 42 comprises conductive material, such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments the conductive material may include one or more metals. Such metals may include one or more of copper (Cu), aluminum (Al), silver (Ag), gold (Au) and iron (Fe); and the granules 44 may be formed by sputter-deposition of such metals. In some embodiments, the conductive material may include one or both of tungsten (W) and titanium (Ti), and may further include one or both of silicon (Si) and nitrogen (N). Accordingly, the conductive material may comprise one or more of W, Ti, WN, TiN, WSi, TiSi, WSiN and TiSiN; where the chemical formulas indicate primary constituents rather than specific stoichiometries.

In some embodiments, the first material may include one or more metals in combination with one or more of boron (B), carbon (C), silicon (Si), germanium (Ge), nitrogen (N) and oxygen (O).

In some embodiments, the first material may include one or both of silicon (Si) and germanium (Ge). If the first material comprises both silicon and germanium, the relative proportion of silicon to germanium may be within a range of from about 1 atomic percent (at %) to about 99 at %. The first material may be a semiconductor material consisting of, or consisting essentially of, one or both of Si and Ge. Alternatively, the first material may be a conductive material which incorporates one or more of boron (B), phosphorus (P) and arsenic (As) into the silicon and/or the germanium. In some example embodiments, the first material may comprise silicon and/or germanium, and may further include one or more additional constituents selected from the group consisting of boron, phosphorus and arsenic. A total concentration of said additional constituents within the first material may be within a range of from about 0.5 at % to about 5 at %. In such embodiments, the first material may be formed by CVD to create the illustrated granules 44.

In embodiments in which the granular first material is an insulative material, the first material may comprise, for example, silicon dioxide, silicon nitride, aluminum oxide, etc.

The large granules of the first material 42 may alleviate the problems described above with reference to prior art FIG. 8. For instance, the large granules may redistribute forces along interior sidewalls of the slits 34 to avoid collapse of the slits, and/or may preclude problematic coalescence of material from one side of a slit 34 with material along the other side of the slit.

The configuration of FIG. 10 shows the granules 44 as discrete granules within the slits 34. In other embodiments, at least some of the granules may agglomerate and/or otherwise merge. For instance, FIG. 11 shows a configuration in which the granules 44 (only some of which are labeled) have merged along interior surfaces of the lined slits 34.

Figure 11:
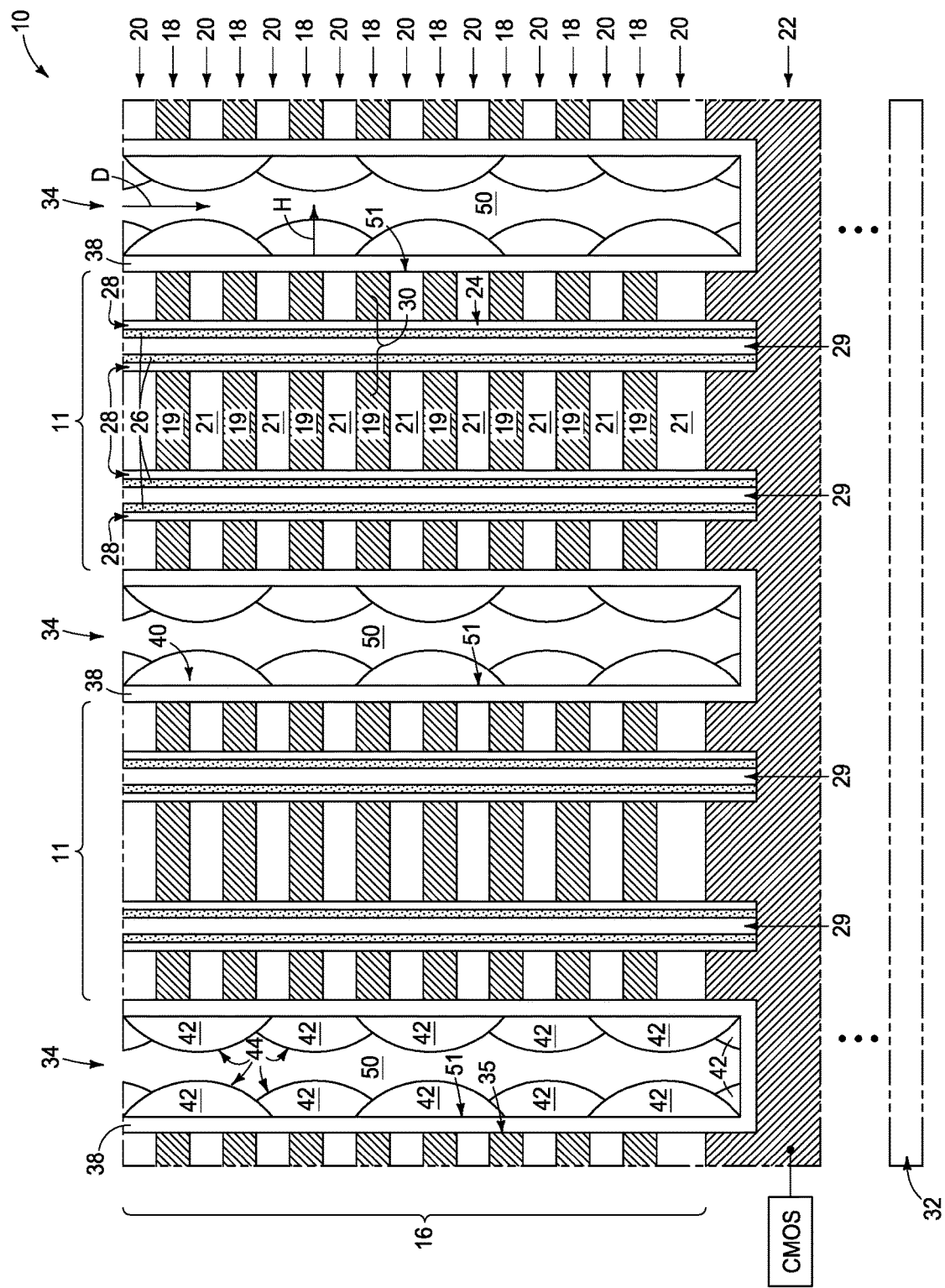
FIG. 11 is a diagrammatic cross-sectional side view of the assembly of FIG. 9 at an example process stage which may follow the process stage of FIG. 9.

In some embodiments, the granules 44 of FIGS. 10 and 11 may be considered to create an undulating topography relative to the sidewalk 35 of the slits 34. In the illustrated embodiment in which the slits 34 are lined with the optional liner material 38, the lined slits may be considered to have sidewalls 51. The undulating topography may be described relative to the sidewalls 51.

Figure 12A:
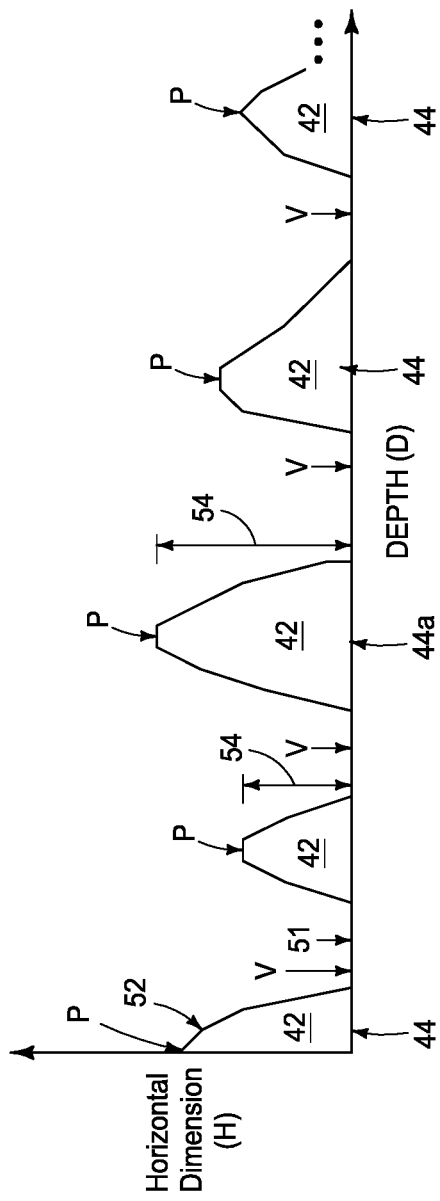
FIG. 12A is a graphical view of a horizontal dimension relative to depth describing roughness of an embodiment similar to that of FIG. 10.

FIG. 12A graphically illustrates a relationship between a horizontal dimension and depth for the granular material 42 within an embodiment analogous to that described above with reference to FIG. 10. The illustrated granular material will be within one of the slits 34. An example horizontal dimension (H) and depth (D) are shown relative to the right-most slit 34 of FIG. 10. FIG. 12A shows that the granules 44 (only some of which are labeled in FIG. 12A) project along the horizontal dimension to form an undulating topography 52 which extends along the surfaces of the granules 44, and along the sidewall surface 51. The undulating topography 52 has peaks (P) and valleys (V); and has a surface roughness which may be quantitated in terms of peak-to-valley distances 54. A couple of example peak-to-valley distances 54 are shown relative to FIG. 12A. The undulating topography may have a surface roughness characterized by a mean roughness parameter ($R_{mean}$) which is the mean peak-to-valley distance along the entirety of an undulating topography 52. In some embodiments, $R_{mean}$ may be at least about 4 nm, at least about 10 nm, at least about 20 nm, at least about 50 nm, at least about 100 nm, etc.

In some embodiments, the surface roughness may also be characterized by a maximum roughness parameter ($R_{max}$), which is the maximum peak-to-valley distance along the undulating topography 52. In the illustrated embodiment, such maximum peak-to-valley distance is associated with a granule labeled 44a in FIG. 12A. In some embodiments, $R_{max}$ may be at least about 10 nm, at least about 20 nm, at least about 50 nm, at least about 100 nm, at least about 150 nm, at least about 200 nm, etc.

Figure 12B:
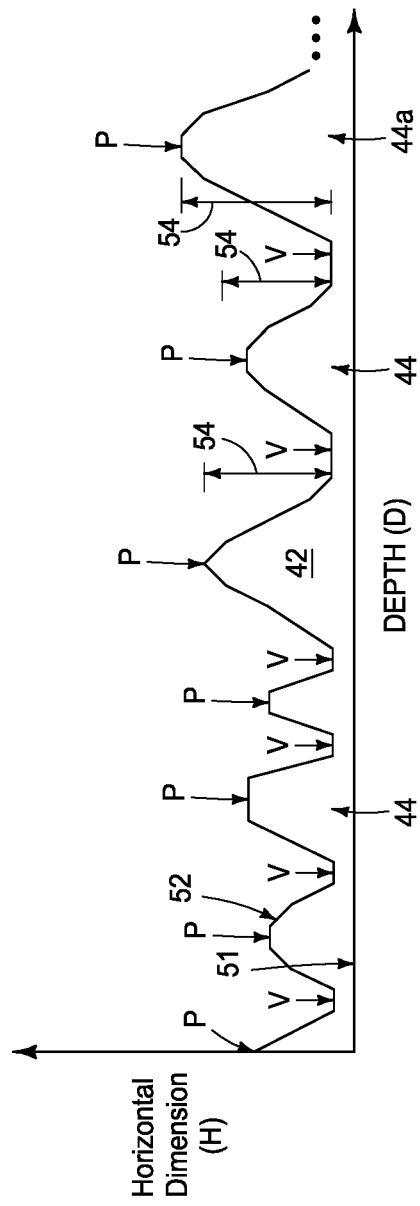
FIG. 12B is a graphical view of a horizontal dimension relative to depth describing roughness of an embodiment similar to that of FIG. 11.

FIG. 12B graphically illustrates a relationship between a horizontal dimension and depth for the granular material 42 within an embodiment analogous to that described above with reference to FIG. 11. An example horizontal dimension (H) and depth (D) are shown relative to the right-most slit 34 of FIG. 11. FIG. 12B shows that the granules 44 (only some of which are labeled in FIG. 12B) project along the horizontal dimension to form the undulating topography 52. Such undulating topography has the peaks (P) and the valleys (V); and has a surface roughness which may be quantitated in terms of the peak-to-valley distances 54. A couple of example peak-to-valley distances 54 are shown relative to FIG. 12B. The mean roughness parameter ($R_{mean}$) of the embodiment of FIG. 12B may be at least about 4 nm, at least about 10 nm, at least about 20 nm, at least about 50 nm, at least about 100 nm, etc.

The undulating topography 52 of FIG. 12B may also be characterized by the maximum roughness parameter ($R_{max}$), and in the illustrated embodiment such corresponds to a peak-to-valley distance associated with a granule labeled 44a in FIG. 12B. The $R_{max}$ of the embodiment of FIG. 12B may be at least about 10 nm, at least about 20 nm, at least about 50 nm, at least about 100 nm, at least about 150 nm, at least about 200 nm, etc.

The undulating topographies 52 of FIGS. 12A and 12B are illustrated relative to the surfaces 51 of the liners 40 within the lined slits 34. It is to be understood that the undulating topographies could also been described relative to the sidewalls 35 of the slits 34, and could be characterized by mean roughness parameters ($R_{mean}$) and maximum roughness parameters ($R_{max}$) at least as large as those described relative to FIGS. 12A and 12B.

Figure 13:
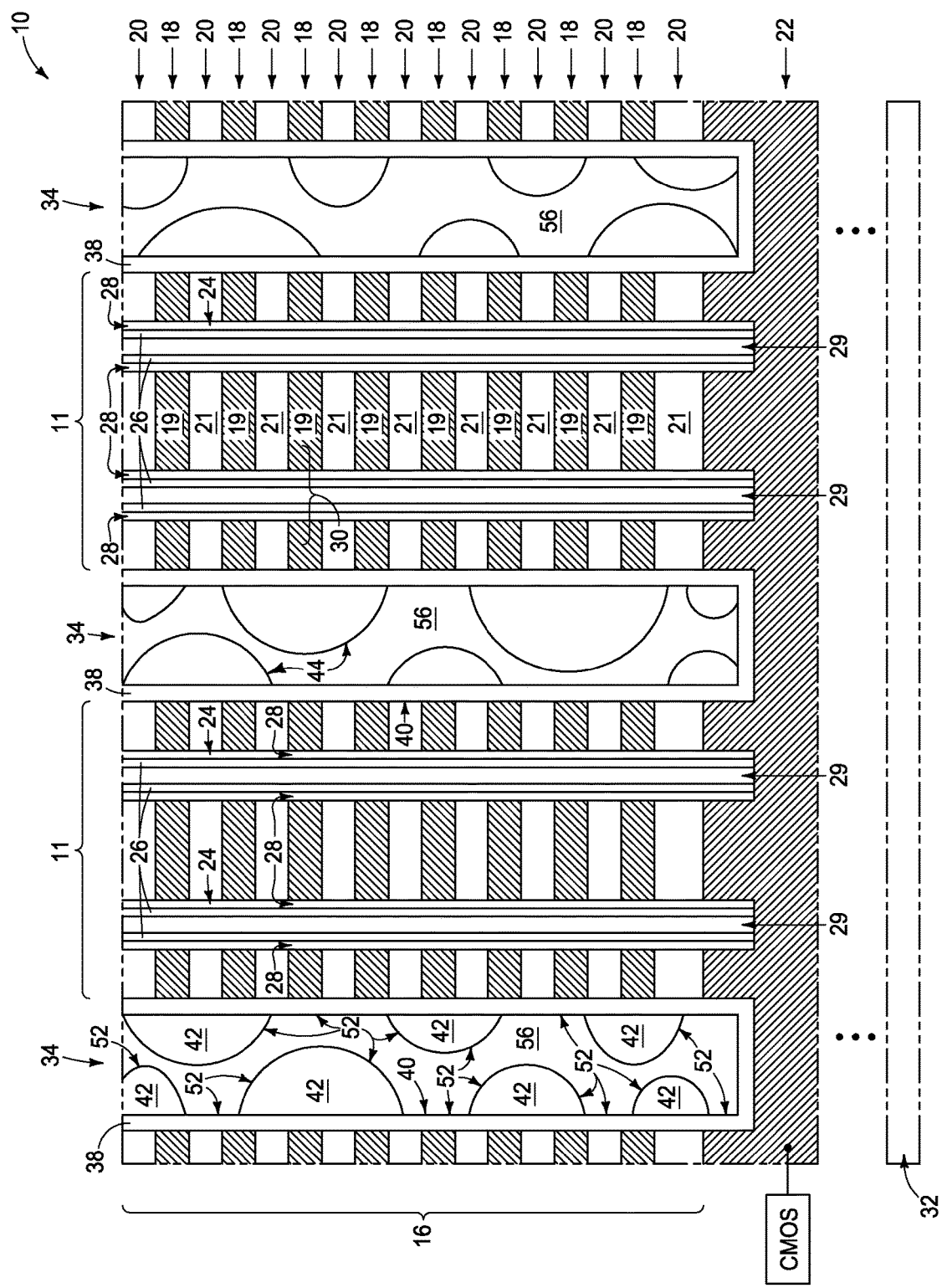
FIG. 13 is a diagrammatic cross-sectional side view of the assembly of FIG. 9 at an example process stage which may follow the process stage of FIG. 10.

Referring to FIG. 13, the integrated assembly (memory device) 10 is shown at a process stage which may follow that of FIG. 10. A second material 56 is formed within the spaces 50 (FIG. 10) between the granules 44 to fill (or at least partially fill) the portions of the slits 34 between the granules 44. The second material may have a different composition than the first material 42. In some embodiments, the second material 56 may be considered to be formed along at least a portion of the undulating topography 52 (with regions of an example undulating topography 52 being shown relative to the left-most slits 34 of FIG. 13). The undulating topography 52 may be considered to be a rugged topography which extends across surfaces of the rugged granular material 42. In some embodiments, the second material 56 may be omitted so that voids remain within the spaces between granules 44. In some embodiments, the second material 56 may be only along top regions of the slits 34 to seal voids within the slits and between the granules 44.

In some embodiments, the individual granules 44 of FIG. 13 may be considered to be at least partially surrounded by the second material 56. In embodiments in which the granules 44 correspond to discrete grains, such discrete grains may be considered to be at least partially surrounded by the second material 56.

The second material 56 may comprise any suitable composition(s); and in some embodiments may comprise insulative material, conductive material and/or semiconductive material. For instance, in some embodiments the second material 56 may comprise silicon dioxide formed by a spin-on dielectric (SOD) process. In some embodiments, the second material may include one or more of titanium nitride, silicon nitride, aluminum oxide, tungsten, silicon dioxide, semiconductor material (e.g., silicon, germanium, etc.), etc. The second material 56 may be formed by one or more of ALD, CVD, PVD, etc.

If the second material 56 comprises semiconductor material (e.g., silicon), the semiconductor material may be in any suitable physical form (e.g., one or more of polycrystalline, amorphous, etc.).

In some embodiments, the second material may comprise one or more of titanium, tungsten and silicon. In some embodiments, the second material may comprise one or both of oxygen and nitrogen in combination with one or more of titanium, tungsten and silicon (e.g., may comprise TiO, SiO, SiN, TiN, TiSiN, WN, etc.; where the chemical formulas indicate primary constituents rather than specific stoichiometries).

In some embodiments, the large granules 44 may be considered to provide support to the block regions 11 to prevent them from bending during the formation of the till material 56.

The first and second materials 42 and 56 may be together considered to be a composite till formed within the slits 34.

Figure 14:
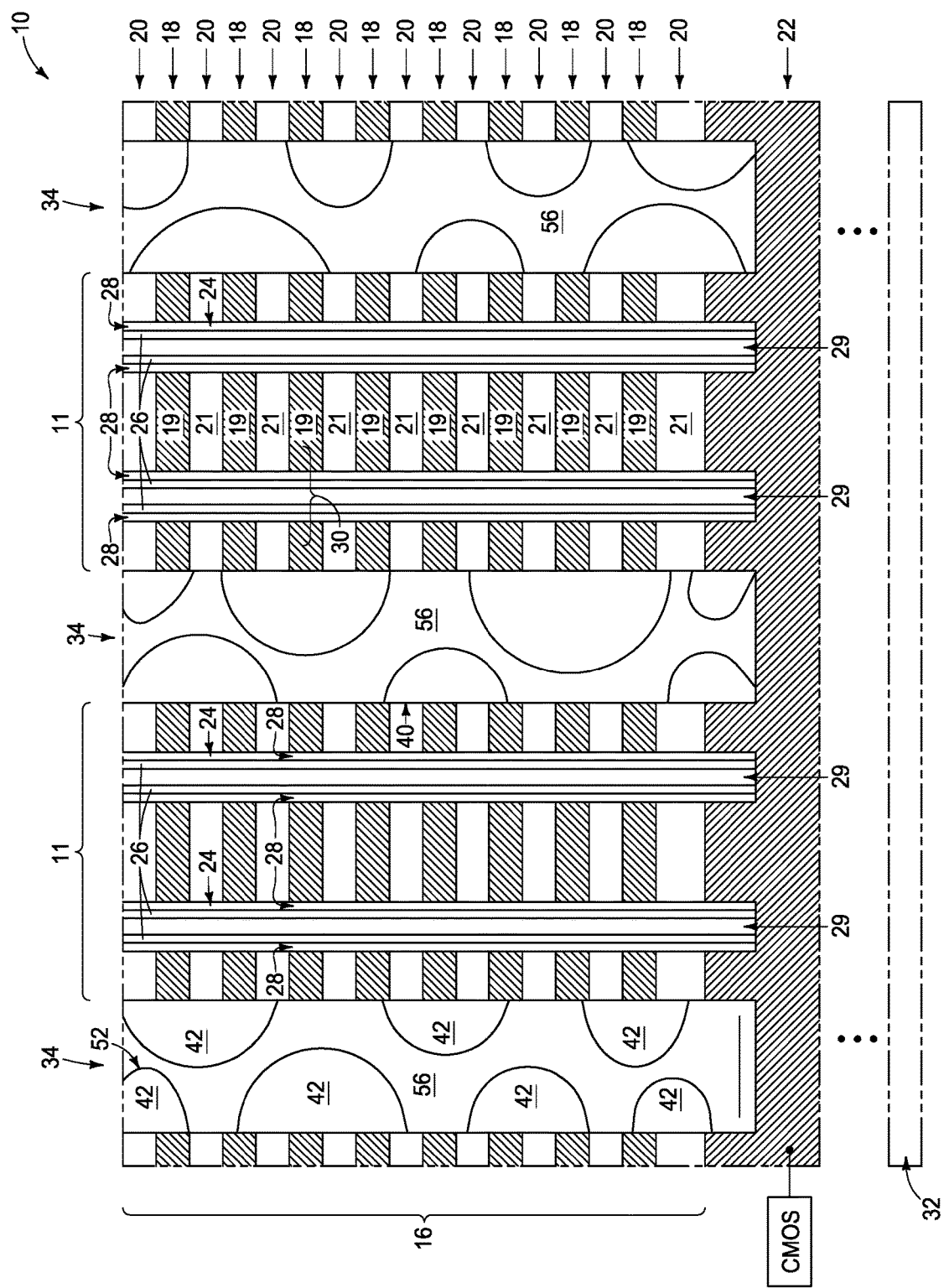
FIG. 14 is a diagrammatic cross-sectional side view of another example integrated assembly.

The liners 40 may be provided as insulative barriers in applications in which one or both of the first and second materials 42 and 56 is conductive. If the materials 42 and 56 are insulative, the liners 40 may be omitted. FIG. 14 shows the integrated assembly (memory device) 10 in an application in which the first and second materials 42 and 56 are insulative, and in which the liners 40 (FIG. 13) are omitted.

Accordingly, the first and second materials 42 and 56 are directly against the materials 19 and 21 of the stack 16.

Figure 15:
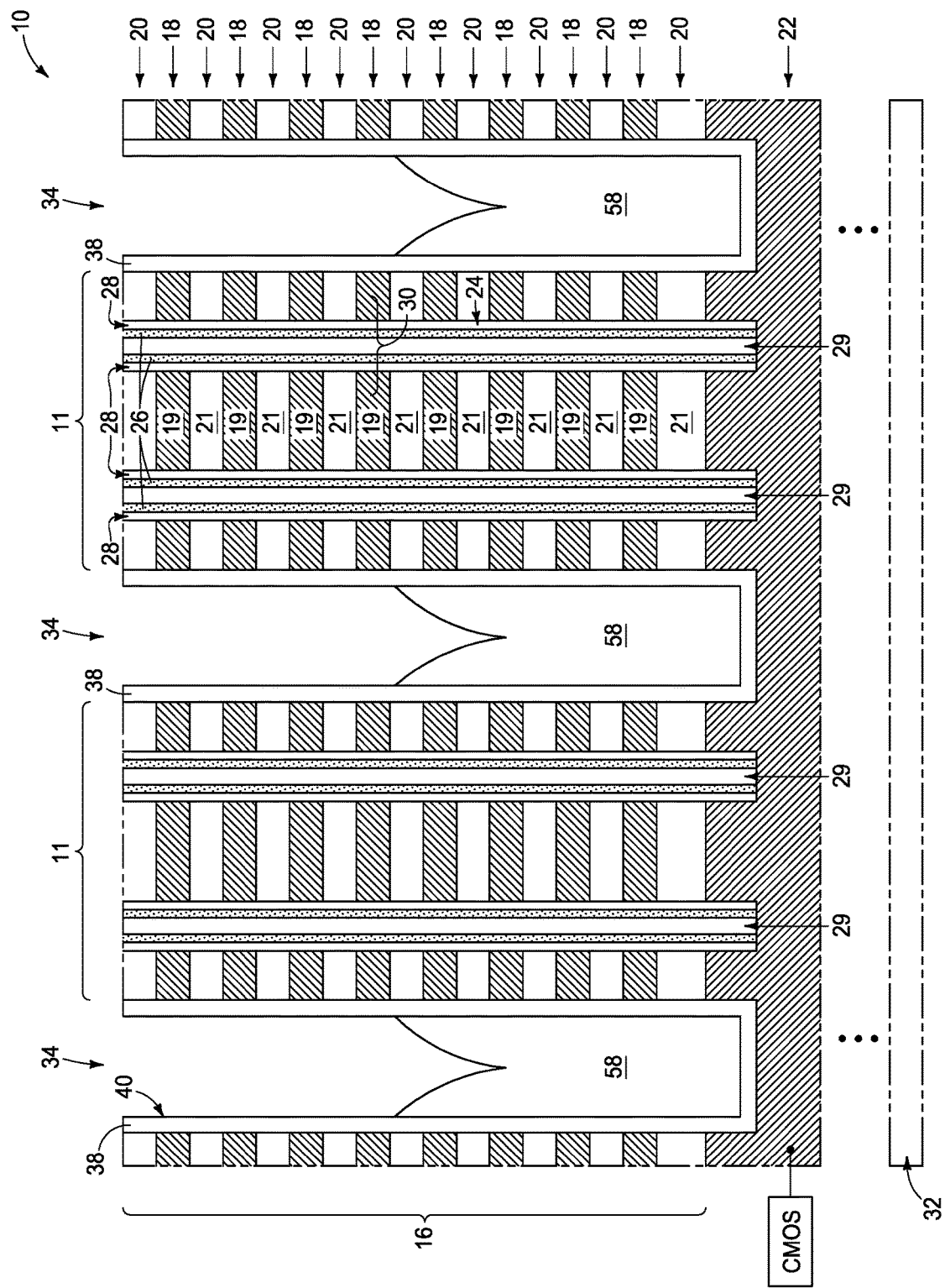
FIG. 15 is a diagrammatic cross-sectional side view of another example integrated assembly.

In some embodiments, the slits 34 may be partially filled prior to forming the granules 44 of the first material 42. For instance, FIG. 15 shows an embodiment in which the slits 34 are partially filled with a material 58. The material 58 may be referred to as a third material to distinguish it from the first material 42 and the second material 56 described previously.

The material 58 may comprise any suitable composition(s). In some embodiments the material 58 may comprise one or more of the materials described above as being suitable for the second material 56 (e.g., may comprise silicon dioxide, silicon nitride, semiconductor material, etc.).

In the illustrated embodiment, the optional barrier material (liner material) 38 is provided within the slits 34. In other embodiments, such barrier material may be omitted.

The slits 34 may be filled with the material 58 to a level which reduces an overall amount (volume) of the slits which will be subsequently filled with the first and second materials 42 and 56, and yet which is not cause the problematic block-bending described above with reference to FIG. 8. In some embodiments, the material 58 may fill from about 1% to about 99% of the volume of the lined slits 34.

Figure 16:
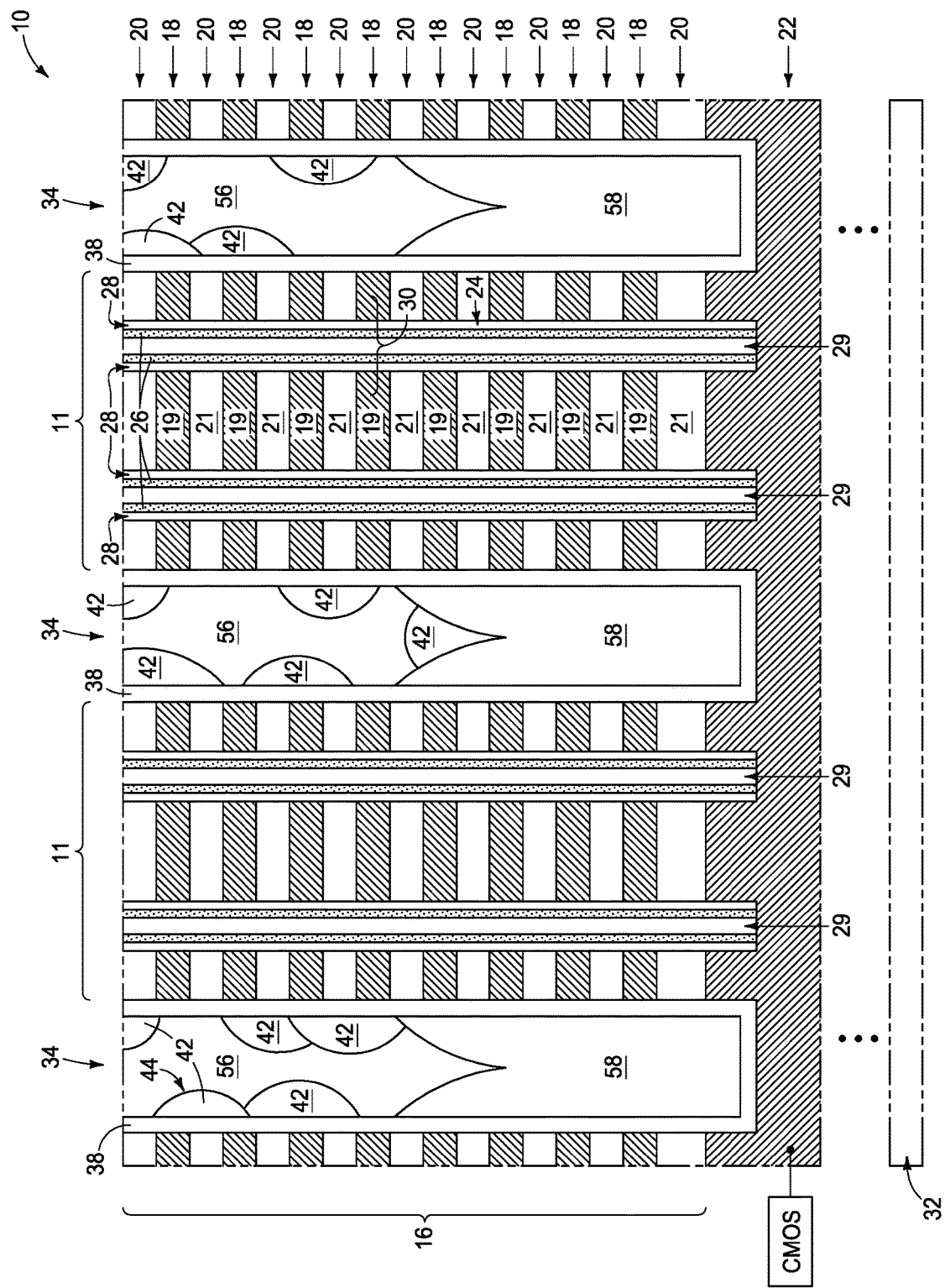
FIG. 16 is a diagrammatic cross-sectional side view of the assembly of FIG. 15 at an example process stage which may follow the process stage of FIG. 15.

Referring to FIG. 16, the first and second materials 42 and 56 are formed within the slits 34 to fill the regions of the slits over the material 58. In some embodiments, the second and third materials 56 and 58 may comprise a same composition as one another. In other embodiments, the second and third materials 56 and 58 may comprise different compositions relative to one another. The first, second and third materials 42, 56 and 58 may be together considered to be a composite fill formed within the slits 34.

Figure 17:
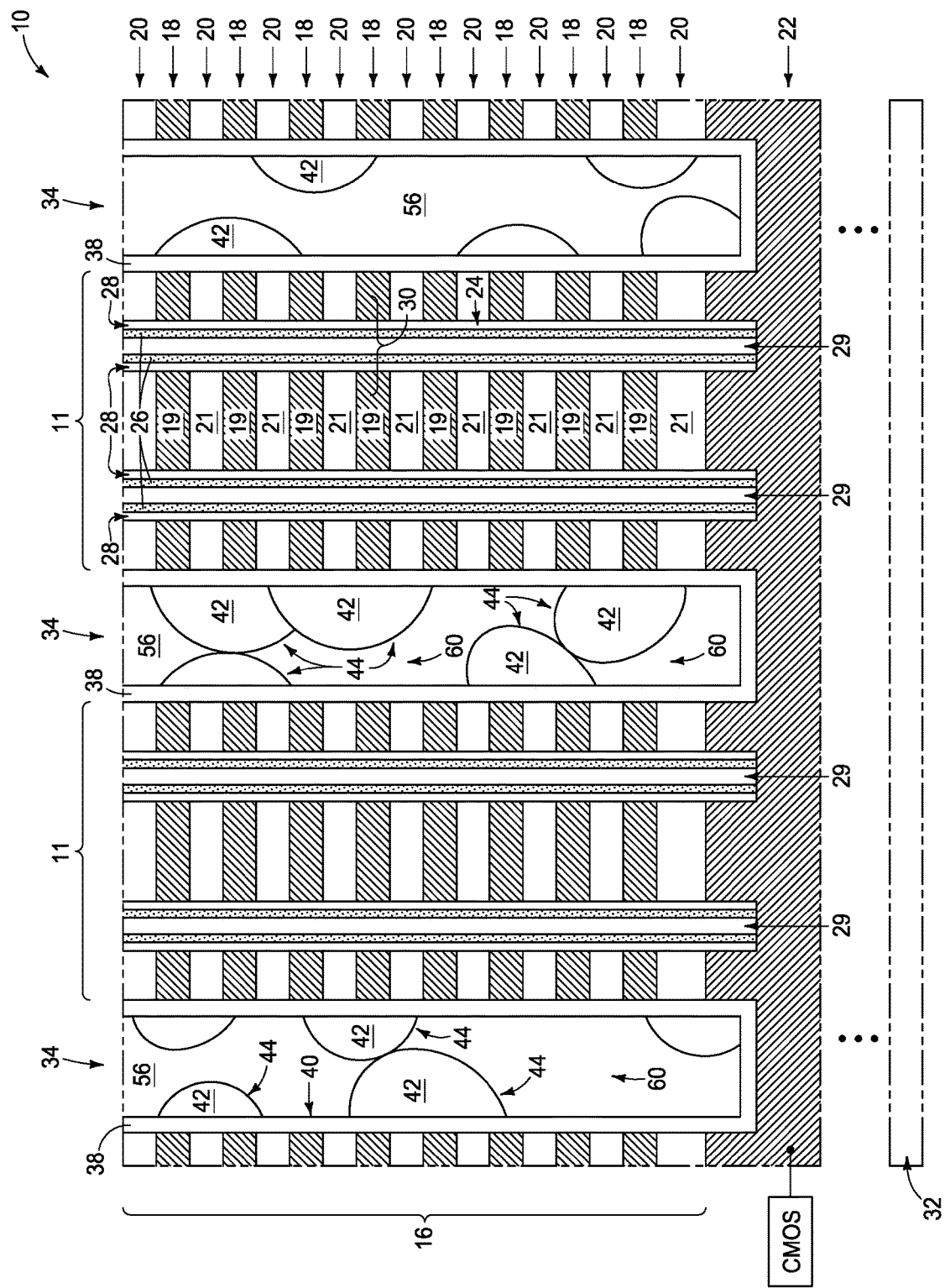
FIG. 17 is a diagrammatic cross-sectional side view of another example integrated assembly.

In some embodiments, the granules 44 may pinch off regions of the slits 34 so that voids remain within regions of the slits after the second material 56 is formed. For instance, FIG. 17 shows an example integrated assembly (memory device) 10 at a process stage analogous to that of FIG. 13 in an application which the granules 44 have pinched off regions of the slits 34 prior to forming the second material 56. Accordingly, voids 60 remain within some regions of the slits 34. The voids 60 are at least partially surrounded with the first material 42 of the granules 44. It is noted that having granules 44 touching opposite walls of the slits 34 may provide desired structural support to alleviate or prevent block-bending, as shown relative to the central slit 34 of FIG. 17. It is also noted that even though it appears that the granules 44 are pinching off voids along the cross-section of FIG. 17, the voids may extend in and out of the page relative to the cross-section of FIG. 17 and may have regions out of the plane of FIG. 17 which are exposed (not pinched off by the granules 44).

Figure 18A:
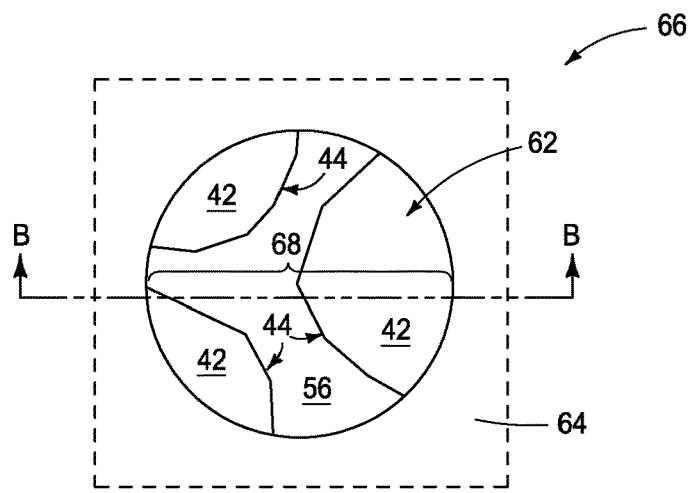
FIGS. 18A and 18B are a diagrammatic cross-sectional top-down view (FIG. 18A), and a diagrammatic cross-sectional side view (FIG. 18B) of another example integrated assembly. The cross-section of FIG. 18A is along the line A-A of FIG. 18B, and the cross-section of FIG. 18B is along the line B-B of FIG. 18A.
Figure 18B:
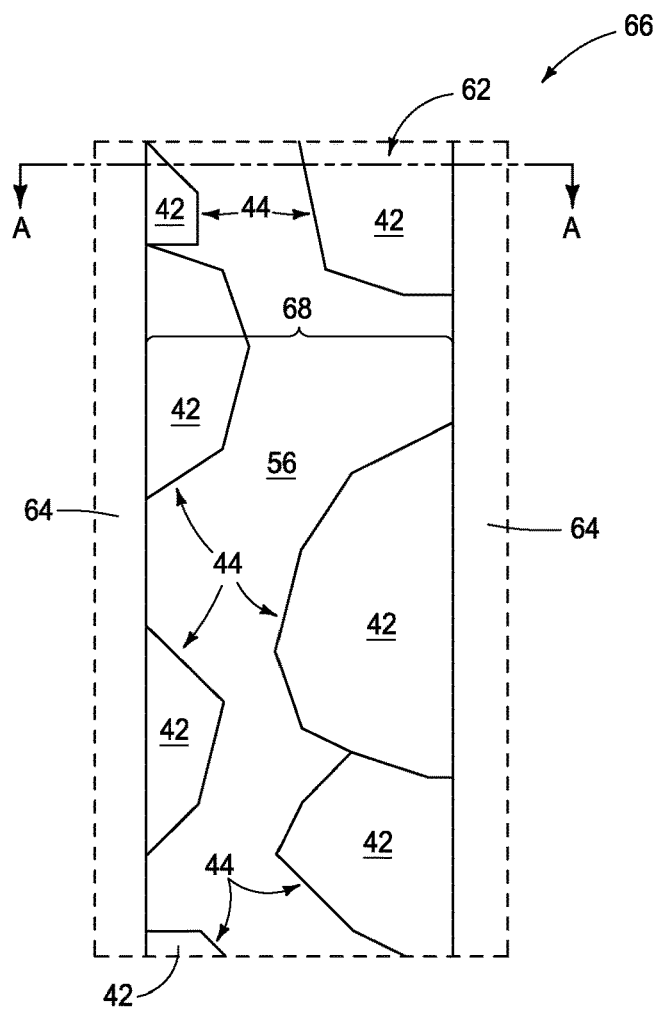

The slits 34 are examples of openings which may be filled with the composite fill configurations described above. In other applications, other types of openings may be filled with such composite fill configurations. FIGS. 18A and 18B diagrammatically illustrate an example opening 62 formed to extend through a material 64 of an integrated structure 66. A composite fill 68 is within the opening. The composite fill comprises the first and second materials 42 and 56 described above; with the first material 42 being configured as the granules 44.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a structure having an opening extending into an integrated configuration. A material is within the opening, and is configured to create an undulating topography relative to a sidewall of the opening. The undulating topography has a surface roughness characterized by a mean roughness parameter $R_{mean}$ which is the mean peak-to-valley distance along the undulating topography. The $R_{mean}$ is at least about 4 nm.

Some embodiments include a structure having an opening extending into an integrated configuration. A first material is within the opening, and is configured to create an undulating topography relative to a sidewall of the opening. The undulating topography has a surface roughness characterized by a mean roughness parameter $R_{mean}$ which is the mean peak-to-valley distance along the undulating topography. The $R_{mean}$ is at least about 4 nm. A second material is within the opening and along at least a portion of the undulating topography. The first and second materials are compositionally different from one another.

Some embodiments include an integrated assembly having a vertical stack of alternating insulative levels and conductive levels. A slit extends through the stack. A granular first material is within the slit and has a mean granule maximum dimension ($Dmax_{mean}$) along a cross-section of at least about 4 nm. The granular first material partially fills the opening to leave unfilled regions between grains of the granular first material. A second material is within at least some of the unfilled regions. The first and second materials are compositionally different from one another.

Some embodiments include a method of forming an integrated assembly. A vertical stack of alternating insulative levels and conductive levels is formed. Channel material pillars are formed to extend through the stack. A slit is formed to extend through the stack. A panel is formed within the slit. The forming of the panel comprises forming a first material within the slit to partially fill the slit, and forming a second material within the partially-filled slit. A surface of the first material is comprised by an undulating outer topography characterized by a mean roughness parameter $R_{mean}$ which is the mean peak-to-valley distance along the undulating outer topography. The $R_{mean}$ is at least about 4 nm.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A structure, comprising:
an opening extending into an integrated configuration, the opening having a sidewall;
a material within the opening; the material comprising differing dimensioned structures being configured to create an undulating topography relative to the sidewall; the undulating topography having a surface roughness characterized by a mean roughness parameter $R_{mean}$ which is the mean peak-to-valley distance along the undulating topography; the $R_{mean}$ being at least about 4 nm, the differing dimensioned structures comprising a first dimension along the sidewall and a second dimension perpendicular to the first dimension, the first dimension being the greater dimension of the differing dimensioned structures, the differing dimensioned structures comprise amorphous structures;
a liner in the opening between the sidewall and the material;
wherein the material is a first material, and further comprising a second material within the opening and along at least a portion of the undulating topography; the second material being compositionally different than the first material; and wherein the first material includes one or more metals in combination with one or more of boron, carbon, silicon, germanium, nitrogen and oxygen.

2. The structure of claim 1 wherein the first material includes at least one discrete grain which is only partially surrounded by the second material.

3. The structure of claim 1 wherein the first material is an insulative material.

4. The structure of claim 1 wherein the first material is a conductive material.

5. The structure of claim 1 wherein the first material is a semiconductive material.

6. The structure of claim 1 wherein the first material includes one or more metals.

7. The structure of claim 1 wherein the first material includes one or more of Cu, Al, Ag, Au, W and Fe.

8. The structure of claim 7 wherein the second material includes one or more of silicon nitride, aluminum oxide, tungsten, silicon dioxide and semiconductor material.

9. The structure of claim 1 wherein the second material includes one or more of Ti, W and Si.

10. The structure of claim 9 wherein the second material further includes one or both of O and N.

11. The structure of claim 1 wherein the first material comprises one or both of Si and Ge.

12. The structure of claim 11 wherein the first material further includes one or more additional constituents selected from the group consisting of B, P and As; with a total concentration of said additional constituents within the first material being within a range of from about 0.5 at % to about 5 at %.

13. The structure of claim 1 wherein the surface roughness is also characterized by a maximum roughness parameter $R_{max}$ which is the maximum peak-to-valley distance along the undulating topography; and wherein the $R_{max}$ is at least about 10 nm.

14. The structure of claim 1 wherein the $R_{mean}$ is at least about 10 nm.

15. The structure of claim 1 wherein the $R_{mean}$ is at least about 20 nm.

16. The structure of claim 1 wherein the $R_{mean}$ is at least about 50 nm.

17. The structure of claim 1 wherein the integrated configuration comprises a vertical stack of alternating insulative levels and conductive levels, and wherein the opening extends through the stack.

18. The structure of claim 17 wherein the liner is insulative, and wherein the first and second materials are within the lined opening.

19. The structure of claim 1 wherein the second material fills only a bottom portion of the opening.

20. The structure of claim 1 wherein the second material covers only some of the differing dimensioned structures.

21. The structure of claim 1 wherein at least one of the differing dimensioned structures overlaps and rests upon a portion of a structure of one adjacent differing dimensioned structure.

22. The structure of claim 1 wherein at least one of the differing dimensioned structures contacts another one of the differing dimensioned structures.

23. The structure of claim 1 wherein the second material and the first material that comprises differing dimensioned structures are the only two materials completely filling the opening.

24. The structure of claim 1 wherein each differing dimensioned structure is spaced from other differing dimensioned structures and not one differing dimensioned structure contacts another differing dimensioned structure.

25. The structure of claim 1 wherein each differing dimensioned structure is configured as a spherical cap.

26. A memory device, comprising:
a vertical stack of alternating insulative levels and conductive levels;
a slit extending through the stack;
a granular first material within the slit and having a mean granule maximum dimension ($Dmax_{mean}$) along a cross-section of at least about 4 nm; the granular first material partially filling the opening to leave unfilled regions between grains of the granular first material; each grain of the granular first material comprising a peripheral surface in the slit, the peripheral surface is not curved and has corners, each grain is spaced from other grains and not one grain is contacting another one grain;
a second material within at least some of the unfilled regions; the second material being compositionally different than the first material;
channel material pillars extending through the stack; and memory cells along the channel material pillars.

27. The memory device of claim 26 wherein the slit separates a first block region from a second block region.

28. The memory device of claim 26 wherein the granular first material is directly against one or more of the conductive levels.

29. The memory device of claim 26 comprising one or more voids at least partially surrounded by the first material.

30. The memory device of claim 26 wherein the slit is lined with an insulative liner, and wherein the first and second materials are within the lined slit.

31. The memory device of claim 26 wherein the $Dmax_{mean}$ is at least about 10 nm.

32. The memory device of claim 26 wherein the slit has a width along the cross-section, and wherein the $Dmax_{mean}$ is at least about 2% of said width.

33. The memory device of claim 26 wherein the slit has a width along the cross-section, and wherein the $Dmax_{mean}$ is at least about 5% of said width.

34. The memory device of claim 21 wherein the slit has a width along the cross-section, and wherein the $Dmax_{mean}$ is at least about 10% of said width.

35. The memory device of claim 26 wherein the first material includes one or more of Cu, Al, Ag, Au, W, Ti and Fe.

36. The memory device of claim 26 wherein the first material comprises one or both of Si and Ge, and further includes one or more additional constituents selected from the group consisting of B, P and As; with a total concentration of said additional constituents within the first material being within a range of from about 0.5 at % to about 5 at %.

37. The structure of claim 26 wherein at least one structure of the granular first material overlaps and rests upon a portion of a second structure of an another one of the granular first material.

38. The structure of claim 26 wherein at least one structure of the granular first material contacts another structure of the granular first material.

39. The memory device of claim 26 wherein the second material fills only a bottom portion of the slit.

40. The memory device of claim 26 wherein the granular first material and the second material are the only two materials in the opening.

41. The memory device of claim 26 wherein each grain is an amorphous structure.

42. A method of forming an integrated assembly, comprising:
   forming a vertical stack of alternating insulative levels and conductive levels;
   forming channel material pillars to extend through the stack;
   forming a slit to extend through the stack, the silt comprising opposite sidewalls extending from a bottom wall; and
   forming a panel within the slit; the forming of the panel comprising forming a granular first material within the slit to partially fill the slit, and forming a second material within the partially-filled slit; the granular first material comprising differing dimensioned structures, each differing dimensioned structure being structurally configured differently from any other differing dimension structure and having a surface comprised by an undulating outer topography; the undulating outer topography being characterized by a mean roughness parameter $R_{mean}$ which is the mean peak-to-valley distance along the undulating outer topography; the $R_{mean}$ being at least about 4 nm;
   forming at least one of the differing dimension structures to be in the slit and not contacting the opposite sidewalls of the slit and not contacting the bottom wall of the slit; and
   wherein the first material is a sputter-deposited metal.

43. The method of claim 42 wherein the sputter-deposited metal includes one or more of Cu, Al, Ag, Au and Fe.

44. The method of claim 42 wherein the first material includes at least one discrete grain which is at least partially surrounded by the second material.

45. The method of claim 42 wherein the first material comprises one or both of Si and Ge.

46. The method of claim 45 wherein the first material further includes one or more additional constituents selected from the group consisting of B, P and As; with a total concentration of said additional constituents within the first material being within a range of from about 0.5 at % to about 5 at %.

47. The method of claim 42 wherein one or more voids remain within the slit after the forming of the second material within the partially-filled slit.

48. The method of claim 42 further comprising:
   lining the slit with an insulative liner; and
   forming the first and second materials within the lined slit.

49. The method of claim 48 wherein the insulative liner comprises one or both of silicon dioxide and silicon nitride.

50. The structure of claim 42 wherein at least one of the differing dimensioned structures overlaps and rests upon a portion of a structure of one adjacent differing dimensioned structure.

51. The structure of claim 42 wherein at least one of the differing dimensioned structures contacts another one of the differing dimensioned structures.

52. The method of claim 42 further comprising filling the slits with a second material wherein the second material and the granular first material are the only two materials that completely fill the slits.

53. The method of claim 42 wherein each differing dimensioned structure is spaced from other differing dimensioned structures and not one differing dimensioned structure contacts another differing dimensioned structure.

54. The method of claim 42 wherein each differing dimensioned structure is configured as a spherical cap.

55. The method of claim 42 wherein each differing dimensioned structure is an amorphous structure.

56. A structure, comprising:
   an opening extending into an integrated configuration, the opening having a first sidewall opposite a second sidewall;
   a material within the opening; the material comprising differing dimensioned structures being configured to create an undulating topography relative to the sidewall; the undulating topography having a surface roughness characterized by a mean roughness parameter $R_{mean}$ which is the mean peak-to-valley distance along the undulating topography; the $R_{mean}$ being at least about 4 nm; a first differing dimensioned structure extending from the first sidewall of the opening and a second differing dimensioned structure extending from the second sidewall to contact the first differing dimensioned structure, each differing dimensioned structure configured as a spherical cap; and
   wherein the material includes one or more metals in combination with one or more of boron, carbon and germanium.

57. The structure of claim 56 further comprising a second material in the opening wherein the second material and the differing dimensioned structures completely fill the opening.

58. The structure of claim 56 wherein each differing dimensioned structure is an amorphous structure.

59. A structure, comprising:
   an opening extending into an integrated configuration, the opening having a first sidewall opposite a second sidewall;
   a granular material extending into the opening from the first and second sidewalls; the granular material comprising differing dimensioned structures being configured to create an undulating topography relative to the first and second sidewalls; each grain of the granular material comprising a first dimension along the first and second sidewalls and a second dimension perpendicular to the first dimension, the first dimension being a greater dimension than the second dimension; and
   a single material filling the opening with the granular material.

60. The structure of claim 59 wherein the granular material comprises a first grain extending from the first sidewall and a second grain extending from the second sidewall, the first grain extending across the opening to contact the second grain.

61. The structure of claim 59 wherein each differing dimensioned structures are spaced from other differing dimensioned structures and not one differing dimensioned structure contacts another differing dimensioned structure.

62. The structure of claim 59 wherein each differing dimensioned structure is configured as a spherical cap.

63. The structure of claim 59 wherein each differing dimensioned structure is an amorphous structure.

64. A structure, comprising:
   an opening extending into an integrated configuration, the opening having a first sidewall opposite a second sidewall; and
   a granular material extending into the opening from the first and second sidewalls; the granular material comprising differing dimensioned structures being configured to create an undulating topography relative to the first and second sidewalls; each grain of the granular material comprising a peripheral surface in the opening that is not curved and has corners, the granular material of the differing dimensioned structures comprising an amorphous structure.

65. The structure of claim 64 wherein the opening comprises a width dimension and wherein the granular material comprise a horizontal dimension from respective first and second sidewalls into the opening that is at least about 40% of the width dimension of the opening.

66. The structure of claim 64 further comprising a second material in the opening wherein the granular material and the second material are the only two materials that completely fill the opening.

67. The structure of claim 64 wherein each differing dimensioned structure is spaced from other differing dimensioned structures and not one differing dimensioned structure contacts another differing dimensioned structure.

68. A structure, comprising:
an opening extending into an integrated configuration, the opening having opposite sidewalls extending from a bottom wall; and
a granular material extending into the opening starting from the opposite sidewalls; the granular material comprising differing dimensioned structures being configured to create an undulating topography relative to the opposite sidewalls; at least one grain of the granular material in the opening and entirely spaced from, and not contacting, the opposite sidewalls and the bottom wall, each grain is spaced from other grains and not one grain is contacting another one grain.

69. The structure of claim 68 further comprising a second material in the opening, the at least one grain contacting only the second material.

70. The structure of claim 68 further comprising a second material in the opening wherein the granular material and the second material are the only two materials that completely fill the opening.

71. The structure of claim 68 wherein each differing dimensioned structure is configured as a spherical cap.

72. The structure of claim 68 wherein each differing dimensioned structure is an amorphous structure.

73. A structure, comprising:
an opening extending into an integrated configuration, the opening having a first sidewall opposite a second sidewall; and
a granular material extending into the opening and comprising differing dimensioned structures being configured to create an undulating topography relative to the first and second sidewalls; a first grain of the granular material extending from the first sidewall and a second grain of the granular material extending from the second sidewall to contact the first grain, each differing dimensioned structure configured as a spherical cap.

74. The structure of claim 73 wherein the opening comprises a width dimension and wherein the first and second grains comprise a horizontal dimension from first and second sidewalls into the opening that is at least about 25% of the width dimension of the opening.

75. The structure of claim 73 further comprising a second material in the opening wherein the granular material and the second material are the only two materials that completely fill the opening.

76. The structure of claim 73 wherein each differing dimensioned structure is an amorphous structure.

77. A structure, comprising:
an opening extending into an integrated configuration, the opening having a first sidewall opposite a second sidewall;
a first granular structure extending into the opening from the first sidewall;
a second granular structure extending into the opening from the second sidewall and contacting the first granular structure;
the first granular structure comprising a first dimension along the first sidewall and a second dimension perpendicular to the first dimension, the first dimension being a greater dimension than the second dimension;
the first and second granular structures create an undulating topography relative to the first and second sidewalls; and
a single material filling the opening with the first and second granular structures.

78. The structure of claim 77 wherein the first granular structure extends across the opening and contacts the second granular structure.

79. The structure of claim 77 wherein the opening comprises a width dimension and wherein the first and second granular structures comprise a horizontal dimension from respective first and second sidewalls into the opening that is at least about 25% of the width dimension of the opening.

80. The structure of claim 77 wherein the first and second granular structures are amorphous structures.

81. The structure of claim 77 wherein the first and second granular structures are configured as spherical caps.

* * * * *

UNITED STATES PATENT AND TRADEMARK OFFICE
CERTIFICATE OF CORRECTION

PATENT NO. : 11,805,645 B2
APPLICATION NO. : 16/542645
DATED : October 31, 2023
INVENTOR(S) : Nicholas R. Tapias et al.

It is certified that error appears in the above-identified patent and that said Letters Patent is hereby corrected as shown below:

In the Claims

Column 16, Line 46 (Claim 34) – Replace "claim 21" with --claim 26--

Signed and Sealed this
Thirteenth Day of February, 2024

Katherine Kelly Vidal
*Director of the United States Patent and Trademark Office*